(12) United States Patent  
Hedler

(10) Patent No.: US 7,884,488 B2  
(45) Date of Patent: Feb. 8, 2011

(54) SEMICONDUCTOR COMPONENT WITH IMPROVED CONTACT PAD AND METHOD FOR FORMING THE SAME

(75) Inventor: Harry Hedler, Germering (DE)

(73) Assignee: Qimonda AG, Munich (DE)

( * ) Notice: Subject to any disclaimer, the term of this patent is extended or adjusted under 35 U.S.C. 154(b) by 387 days.

(21) Appl. No.: 12/113,352

(22) Filed: May 1, 2008

(65) Prior Publication Data

US 2009/0273097 A1    Nov. 5, 2009

(51) Int. Cl.
*H01L 23/48* (2006.01)
*H01L 21/00* (2006.01)

(52) U.S. Cl. .......... 257/784; 257/E23.01; 257/E21.585; 438/118; 977/723

(58) Field of Classification Search ................. 257/784, 257/21.585, 23.01; 977/723; 438/118
See application file for complete search history.

(56) References Cited

U.S. PATENT DOCUMENTS

| 5,074,947 | A | 12/1991 | Estes et al. |
| 5,847,445 | A | 12/1998 | Wark et al. |
| 6,197,613 | B1 | 3/2001 | Kung et al. |
| 2005/0127478 | A1 | 6/2005 | Hiatt et al. |
| 2006/0046471 | A1 | 3/2006 | Kirby et al. |
| 2006/0071323 | A1* | 4/2006 | Martin et al. ............... 257/698 |
| 2007/0001280 | A1 | 1/2007 | Hua |
| 2007/0152016 | A1 | 7/2007 | Choe et al. |

* cited by examiner

*Primary Examiner*—W. David Coleman
(74) *Attorney, Agent, or Firm*—John S. Economou

(57) ABSTRACT

A structure and method of forming low cost bond pads is described. In one embodiment, the invention includes depositing an insulating layer over a last metal line of a substrate and forming an opening in the insulating layer. A colloid is printed over the insulating layer and fills the opening in the insulating layer. A conductive via and bond pads are formed by heating the colloid.

29 Claims, 24 Drawing Sheets

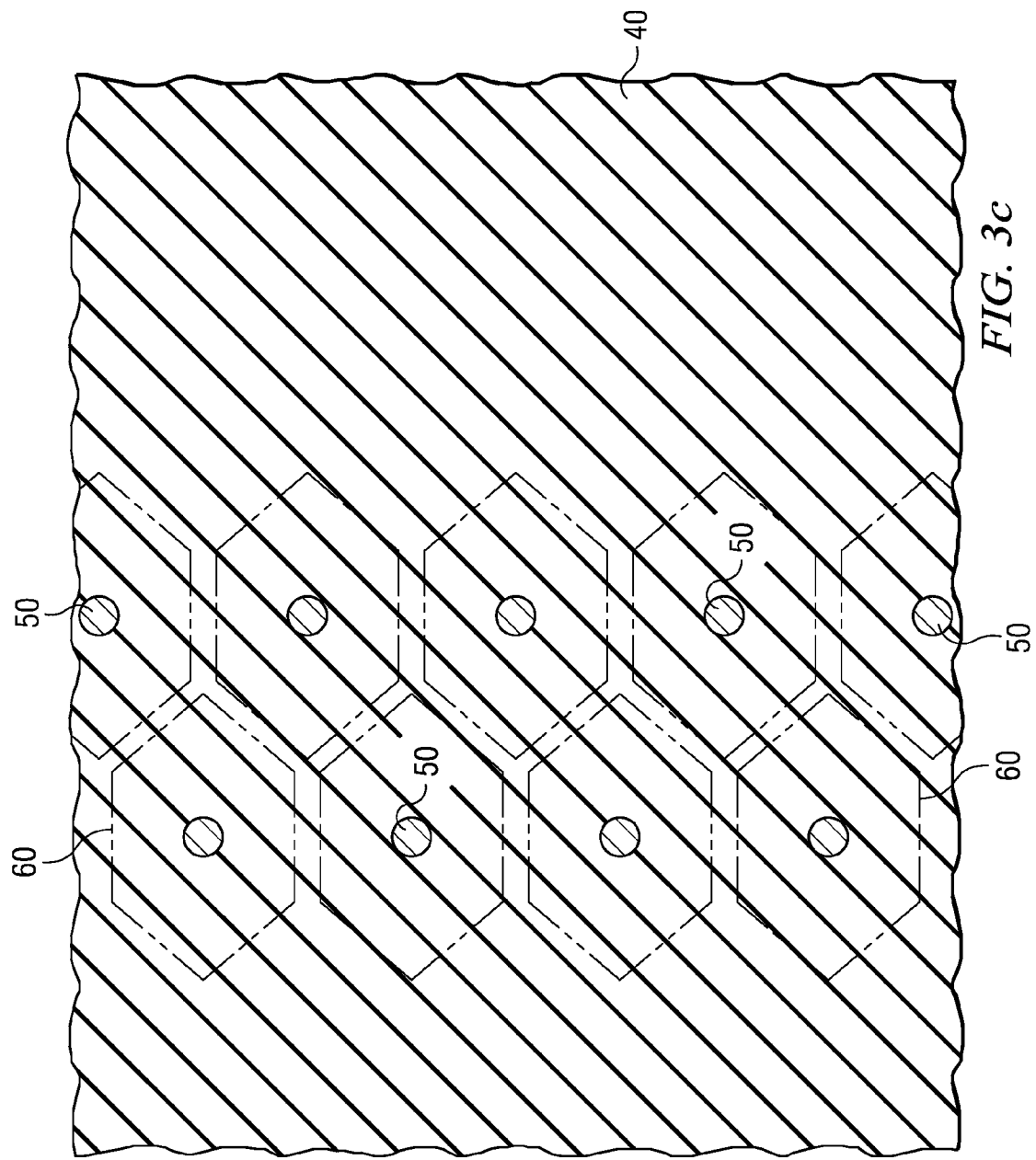

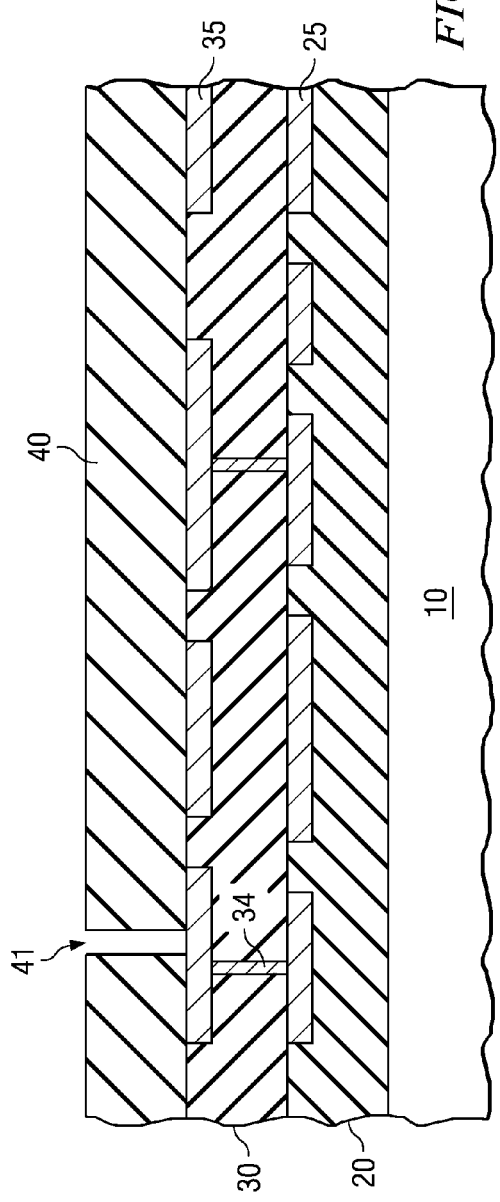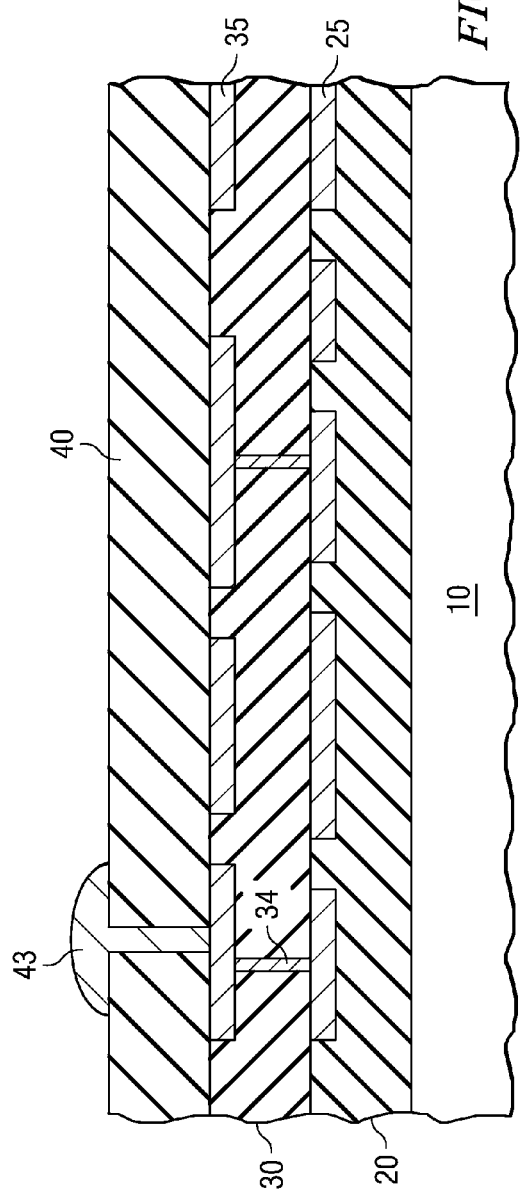

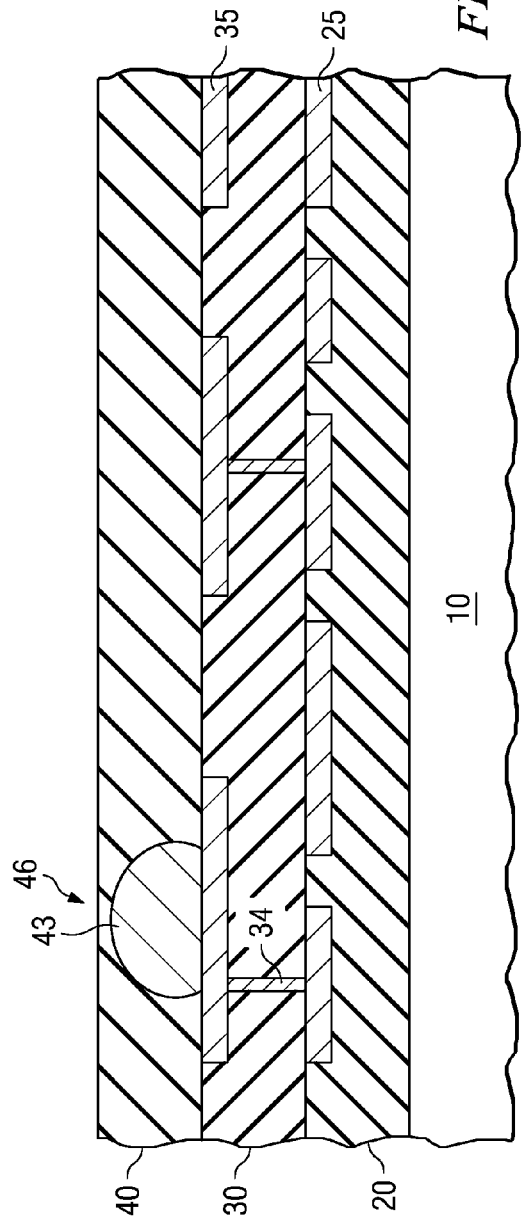
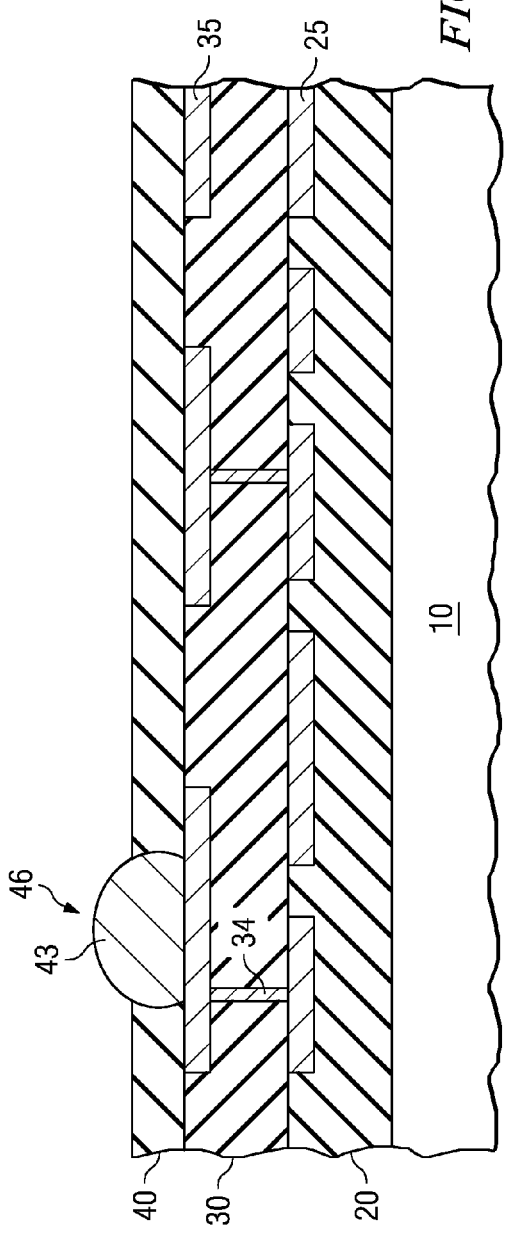

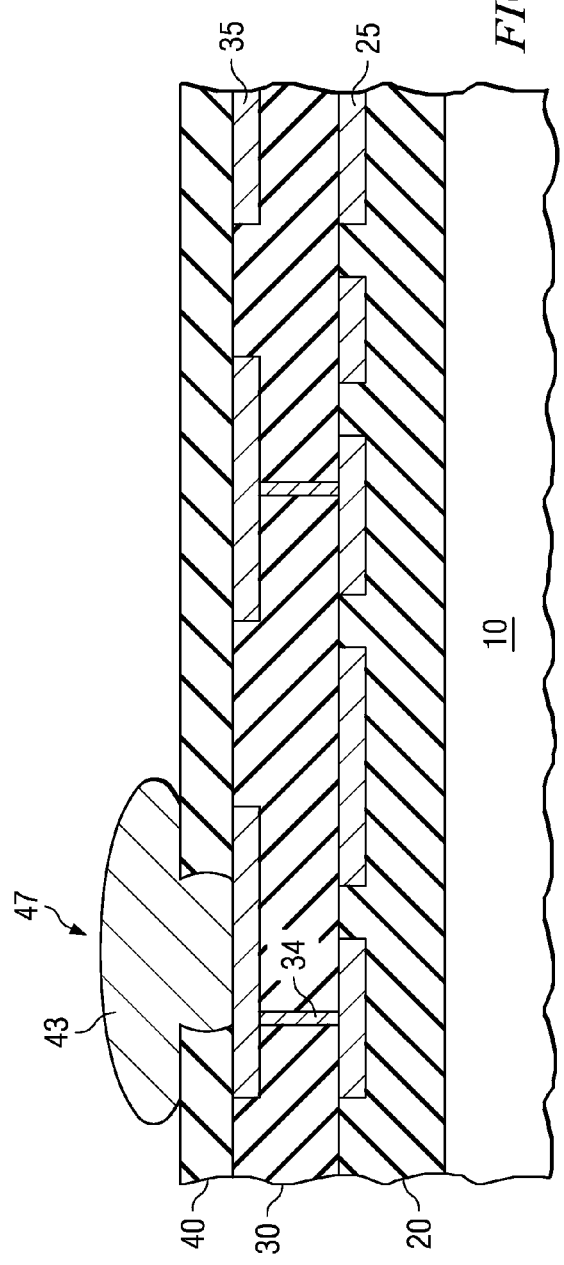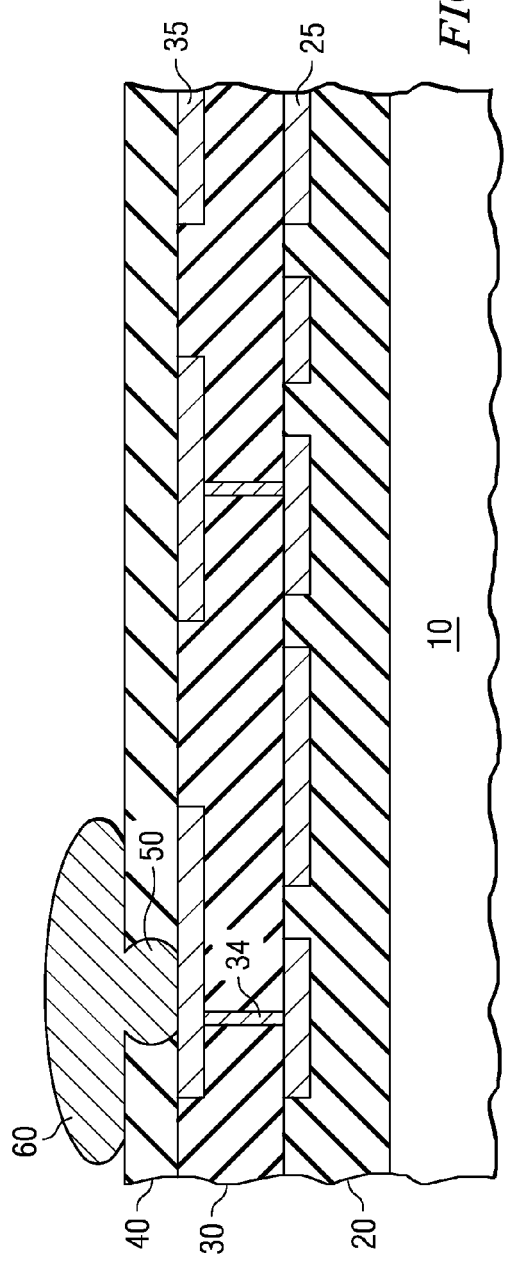

SEMICONDUCTOR COMPONENT WITH IMPROVED CONTACT PAD AND METHOD FOR FORMING THE SAME

TECHNICAL FIELD

This invention relates generally to electronic devices, and more particularly to a semiconductor component with a contact pad.

BACKGROUND

Most electronic devices in use today include many "chips" interconnected to provide a specific functionality. The chips generally comprise a semiconductor die embedded in a package, wherein each die may comprise an integrated circuit formed by standard semiconductor fabrication processes. The semiconductor die typically has a series of bond pads, which are used to make electrical contact to the integrated circuit formed therein. The die is placed on a carrier or substrate that has electrical leads formed therein to correspond to the bond pads of the die. The die and the carrier are enclosed to protect the die from the environment.

In memory structures, bond pads are large structures typically formed on the last metal line. To reduce costs, bond pads may also be formed as part of the last metal level. However, such structures impose additional limitations in metal line routing as the bond pads take up significant real estate on the metal level, adding significant constraints in the routing of metal lines. One way to overcome such limitation is to form bond pads over the last metal line, connected, for example, through a redistribution line. However, this introduces additional process steps. These additional process steps require expensive processing techniques such as lithography techniques, and e.g., subtractive metal patterning.

For almost 25 years, the semiconductor industry has rolled out a new generation of technology almost every two years, delivering improved performance at lower costs. One of the challenges faced in semiconductor manufacturing relates to reduction in process costs with each subsequent technology generation. Consequently, packaging processes also need to reduce fabrication costs with each technology generation. Hence, what are needed in the art are improved structures and methods for producing packages at lower costs.

SUMMARY OF THE INVENTION

These and other problems are generally solved or circumvented, and technical advantages are generally achieved, by embodiments of the present invention.

Embodiments of the invention include methods and structures of low cost bond pads. In accordance with an embodiment of the invention, the method comprises depositing an insulating layer over the last metal line of a substrate, and forming an opening in the insulating layer. The method further comprises printing a colloid over the insulating layer to fill the opening, and heating the colloid to form a conductive via and a bond pad.

The foregoing has outlined rather broadly the features of an embodiment of the present invention in order that the detailed description of embodiments of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1, which includes FIGS. 1a-1e, illustrates a portion of a chip including a bond pad, in accordance with an embodiment of the invention, wherein FIG. 1a illustrates a cross section of a chip with the bond pad, FIG. 1b illustrates a top cross section of the bond pad, FIG. 1c illustrates a via connecting the bond pad to the last metal level of the chip, FIG. 1d illustrates a magnified cross sectional view, and FIG. 1e illustrates a magnified top view;

FIG. 2, which includes FIGS. 2a and 2b, illustrates cross sections of a portion a chip comprising bond pads formed in accordance with embodiments of the invention, wherein FIG. 2a illustrates a mechanical bond pad, and FIG. 2b illustrates electrical and mechanical bond pads;

FIG. 3, which includes FIGS. 3a-3e, illustrates top cross sections of a portion a chip comprising bond pads, in accordance with embodiments of the invention, wherein FIG. 3a illustrates two rows of bond pads coupled to a single row of vias, FIG. 3b illustrates two rows of vias and bond pads, FIG. 3c illustrates two rows of staggered vias and staggered bond pads, FIG. 3d illustrates a single row of circular bond pads, and FIG. 3e illustrates conductive vias formed as trenches;

FIG. 4, which includes FIGS. 4a-4e, illustrates a bond pad at various stages of fabrication, according to an embodiment of the invention;

FIG. 6, which includes FIGS. 6a-6f, illustrates a bond pad at various stages of fabrication, according to an embodiment of the invention;

FIG. 8, which includes FIGS. 8a and 8b, illustrates the microstructure of the bond pad during the fabrication processes according to an embodiment of the invention illustrated in FIG. 4, wherein FIG. 8a illustrates dispersed nano-particles after the application of a nano paste, and FIG. 8b illustrates sintered nano-particles forming a conductive interconnect;

FIG. 9, which includes FIGS. 9a-9c, illustrates structures fabricated using wire bonding, wherein FIG. 9a illustrates a package comprising stacked dies formed by wire bonding, the wire bond loops connecting the bonding pads to the substrate pads, FIG. 9b illustrates a portion of the stacked die illustrating the wire bond loop, and FIG. 9c illustrates a magnified portion illustrating the wire bonding;

FIG. 10, which includes FIG. 11, which includes FIGS. 11a-11d, illustrates an embodiment of an arrangement of bond pads along with test pads, wherein FIG. 11a illustrates a design with a single row of bond pads and test pads, FIG. 11b illustrates a double row of test pads but a single row of bond pads, FIG. 11c illustrates a double row of bond and test pads, and FIG. 11d illustrates two rows of staggered bond and test pads.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely the structure of pads on a semiconductor component, and methods of forming the pads. The invention may also be applied, however, to other semiconductor components and packaging techniques. One of ordinary skill in the art will be able to recognize further examples as well.

Formation of chip packaging requires use of many lithographic steps for forming different levels of the package. This requires the use of expensive masks and lithography tools that increase the cost of the process. In various embodiments, the present invention overcomes these limitations by reducing the number of mask steps or number of masks needed in the fabrication of chip packages. Various embodiments of the invention achieve this by avoiding pad metallization or formation of chip bonding pads over the last metal level. Avoiding this process eliminates mask steps not only in their formation, but also mask steps in forming passivation layers above these chip bonding pads.

The process described in various embodiments below enables the formation of pads of different sizes, shapes and placement with relative ease, and at a very low cost. This added flexibility can be further leveraged to reduce costs and/or reduce complexity of design or fabrication processes. As described in embodiments of the invention, only a small area of the last metal line is used for the bond pad, eliminating large areas from the last metal lines consumed by conventional designs. The eliminated area can be translated into a decrease in chip area and/or complexity of the metal routing. In various embodiments, the pads comprise different sizes, e.g., based on functionality, number of connections or other design parameters, such as bonding regions, etc.

A structural embodiment of the invention will be first described using FIG. 1. Various structural embodiments are next described with respect to FIGS. 2, 3 and 11. Various embodiments of the method of fabrication will then be described using the flow charts of FIGS. 5 and 7 and cross sectional views of FIGS. 4 and 6. A magnified cross section of a portion of the bond pad during the fabrication process is illustrated in FIG. 8. Structural embodiments applied to wire bonding are described in FIG. 9. An embodiment of the invention for forming a flip chip package will be described in FIG. 10.

Figure 1A:
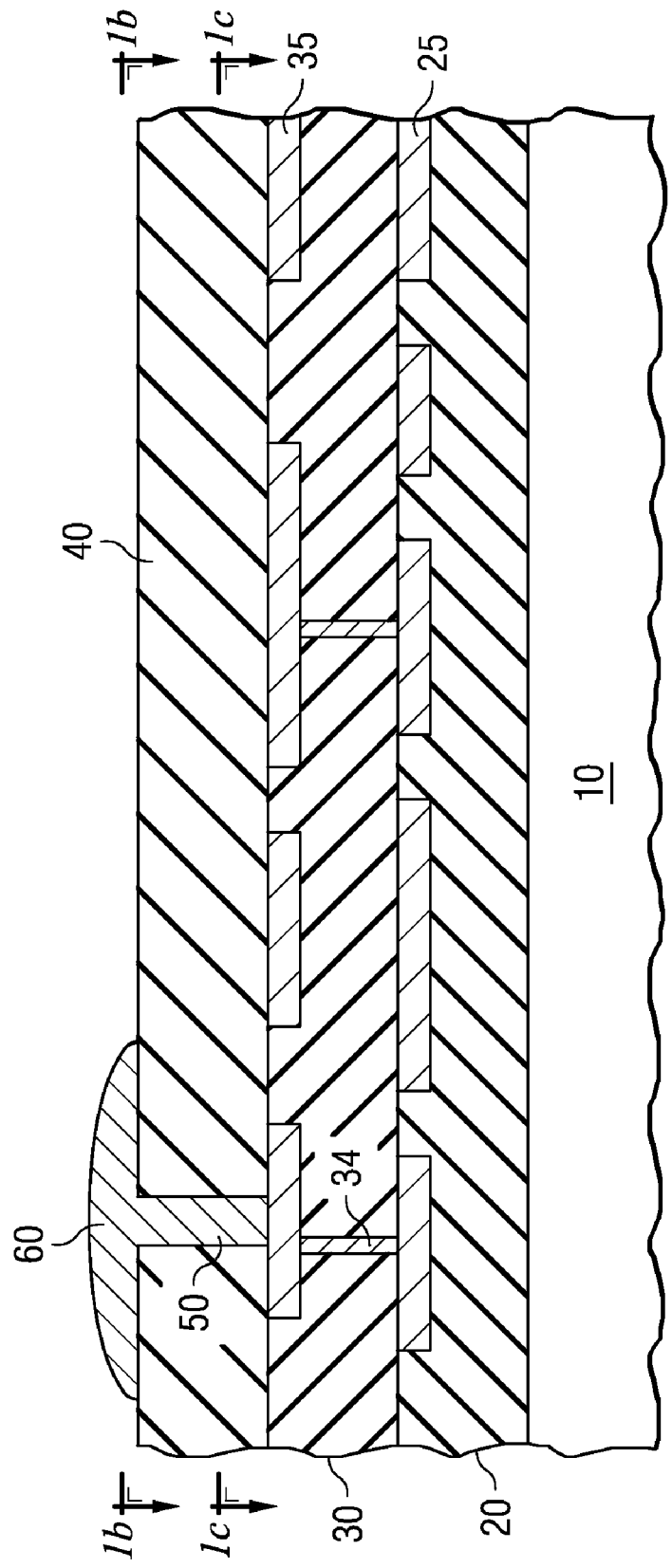

An embodiment of the invention is illustrated in FIG. 1, which includes FIG. 1a-1e. FIG. 1a illustrates a portion of a semiconductor component (before grinding and dicing). Referring to FIG. 1a, the undiced semiconductor component comprises a substrate 10. The substrate 10 comprises a chip formed from a wafer such as a silicon wafer or other substrates such as a Ge wafer, SOI wafer, or <110> Si on <100> Si substrate. The substrate 10 includes active circuitry as well as necessary features such as isolation regions. In various embodiments, the semiconductor component comprises memory devices such a volatile or non volatile memory devices. In one embodiment, the substrate 10 comprises volatile memory devices such as trench capacitors or stack capacitors. The substrate 10 also comprises other essential and peripheral devices such as, for example, selection transistors. The active devices are connected using metallization disposed above the substrate 10. The substrate 10 also comprises necessary isolation regions, such as a trench isolation, to electrically isolate different devices. The substrate 10 also includes dicing regions, such as dicing streets, used for dicing the wafer into individual dies.

A first dielectric layer 20 is disposed above the substrate 10. The first dielectric layer 20 includes vias (not shown) connecting first metal lines 25 to the active devices (not shown) in the substrate 10. A second dielectric layer 30 is disposed on the first dielectric layer 20. The second dielectric layer 30 comprises second vias 34 connecting second metal lines 35 to the first metal lines 25. The first and second dielectric layers 20 and 30 in various embodiments comprise one or more insulating layers. Further, in various embodiments, an additional dielectric layer may be disposed between the first and second dielectric layer 20 and 30, and between the substrate 10 and the first dielectric layer 20.

In one embodiment, the first and second dielectric layers 20 and 30 comprise an oxide. For example, the first and second dielectric layers 20 and 30 may comprise FTEOS, SiN, SiCOH, or other low-k materials. The first and second metal lines 25 and 35 may comprise a conductive material such as copper or aluminum, and preferably comprise aluminum. In some embodiments, the first and second metal lines 25 and 35 comprise an additional conductive liner to form, for example, a diffusion barrier. A passivation layer 40 is disposed over the second dielectric layer 30. The passivation layer 40 is typically an oxide layer. In other embodiments, the passivation layer 40 may comprise FTEOS, SiN, SiCOH, or other low-k materials.

The passivation layer 40 comprises a conductive third via 50, the conductive third via 50 comprising conductive nano-particles. In various embodiments, the conductive nano-particles are sintered together forming a conductive interconnect. In different embodiments, the nano-particles comprise a material selected from the group consisting of silver, copper, tin, lead, and combinations thereof. In one embodiment, the nano-particles comprise pure metallic silver.

Figure 1B:
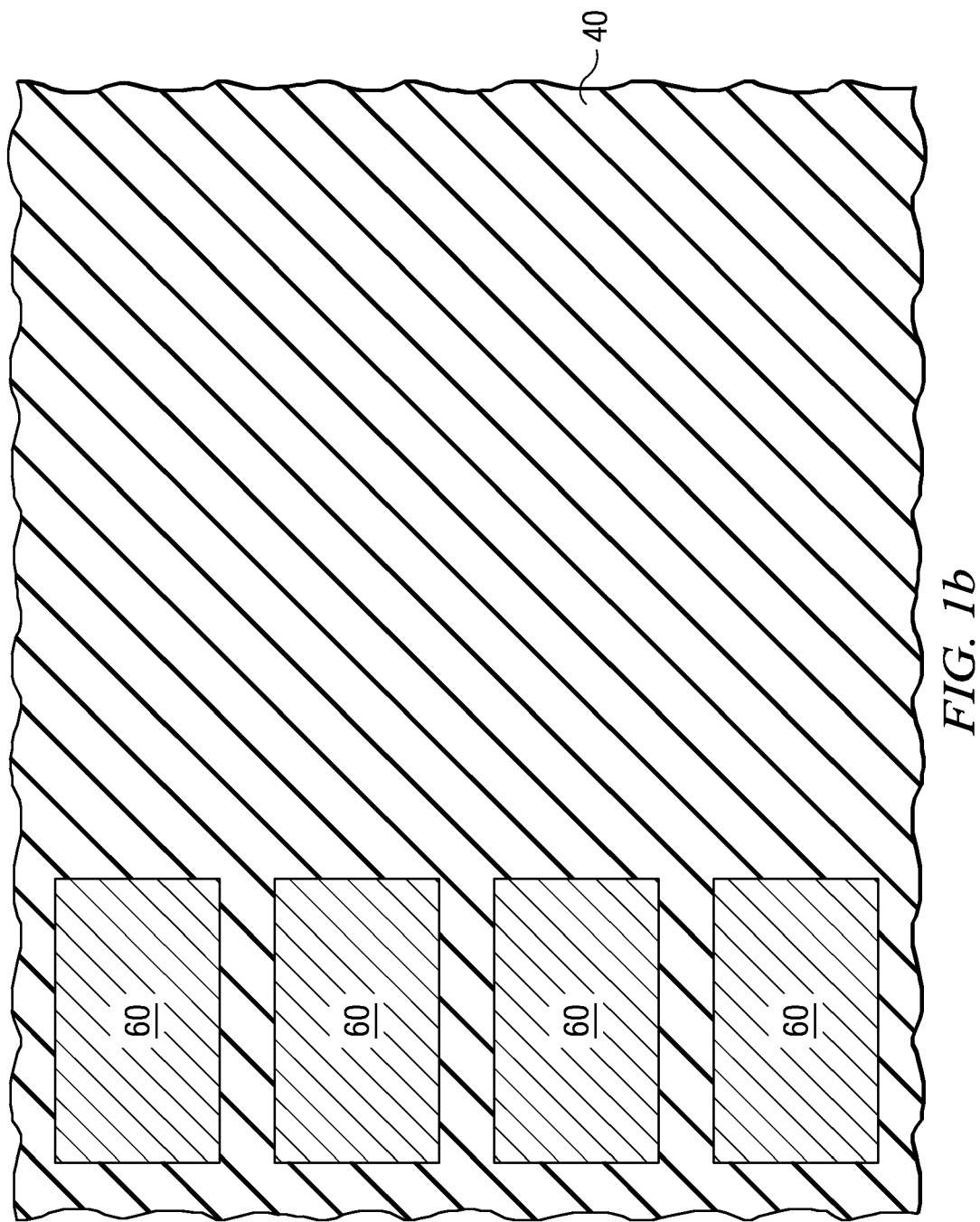

FIG. 1b, taken along line 1b in FIG. 1a, illustrates a top view of a portion of the undiced semiconductor component illustrating a bonding pad 60. As illustrated in FIG. 1a, the bonding pad 60 is disposed above the passivation layer 40.

Figure 1C:
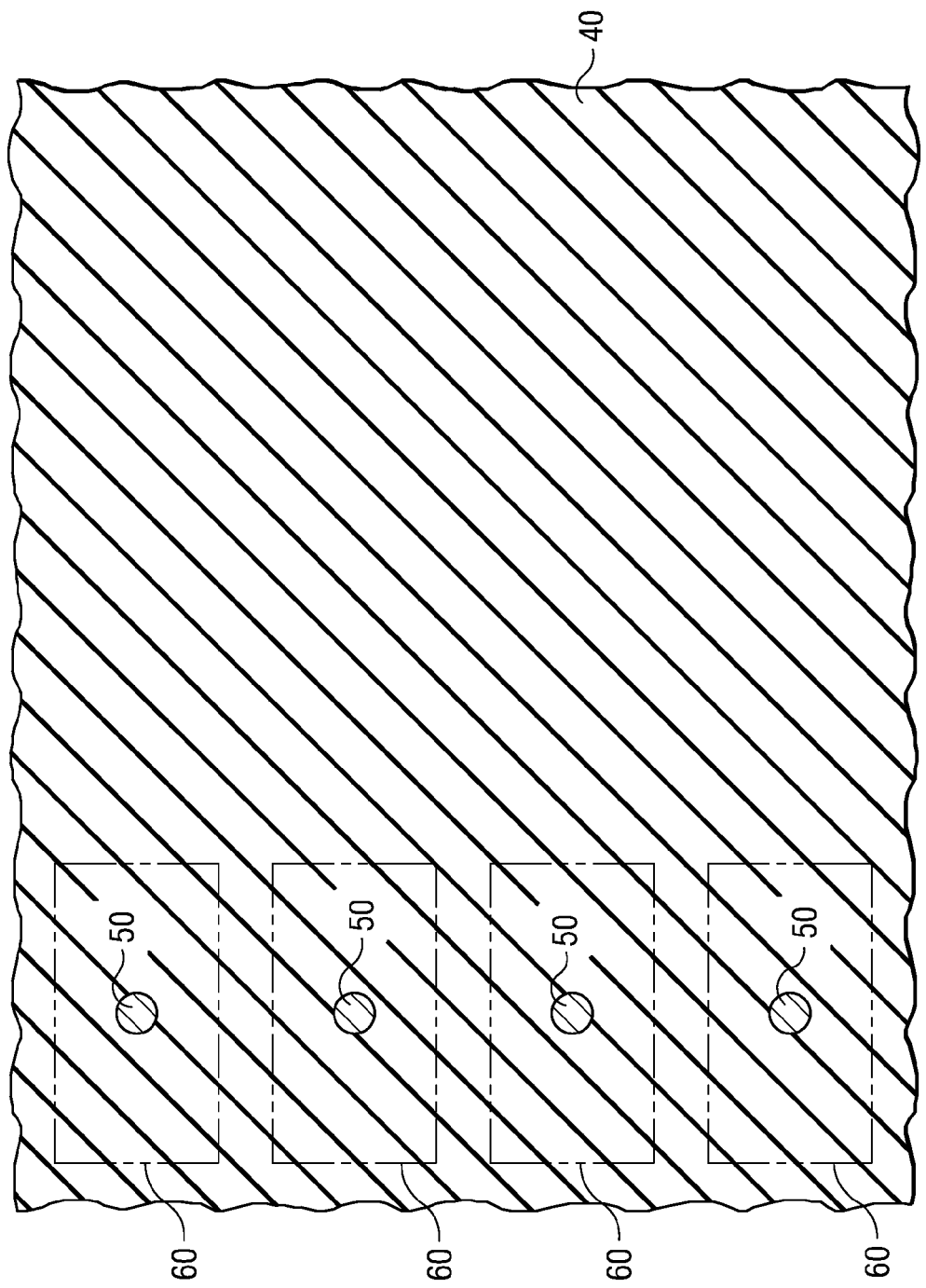

FIG. 1c, taken along line 1c in FIG. 1a, illustrates a top cross sectional view of a portion of the chip illustrated in FIG. 1a, and illustrates bonding pads 60 formed over third vias 50. As the third vias 50 and bonding pads 60 are formed together, the cross sectional area of the third vias 50 can be much smaller than the cross sectional area of the bonding pads 60. For example, in one embodiment, the bonding pads 60 are about 80 µm×80 µm or about 6400 µm or larger. In contrast, in one embodiment, the cross sectional area of the third vias 50 is about 10 µm×10 µm or about 100 µm². In various embodiments, the area of the bonding pads 60 to the area of the third vias 50 is greater than about 50:1. For example, in another embodiment, the bonding pads 60 are about 50 µm×50 µm or about 2500 µm² or larger. In contrast, if the cross sectional area of the third vias 50 is about 10 μm×10 μm or about 100 μm², the area of the bonding pads 60 to the area of the third vias 50 is greater than about 20:1.

Figure 1D:
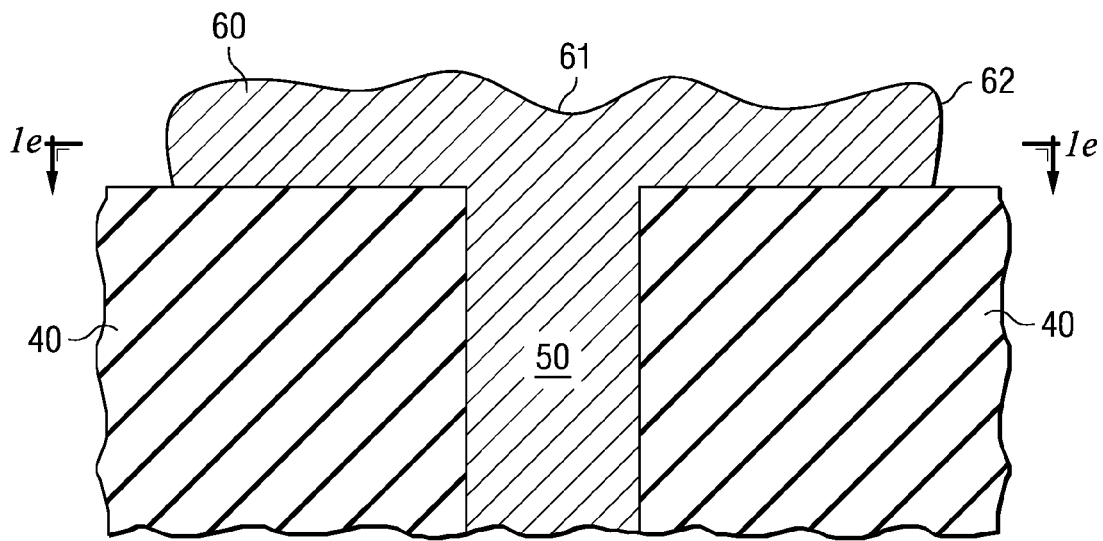

FIG. 1*d* illustrates a magnified cross sectional view of the bonding pad 60. As illustrated in FIG. 1*d*, the bonding pad 60 comprises coarse or rough edges. The in-plane roughness of the pad perimeter is also rough or curved as illustrated in FIG. 1*d*. While a pad defined using conventional techniques such as lithography is more or less accurate perpendicularly in a vertical direction, the new colloidal formed bonding pad 60 comprises sloped rounded features. For example, the bonding pad 60 comprises first curvy features 61 and second curvy features 62 along the edge of the bonding pad 60. The second curvy features 62 illustrate a rounded gradient along the edges of the bonding pad 60.

Figure 1E:
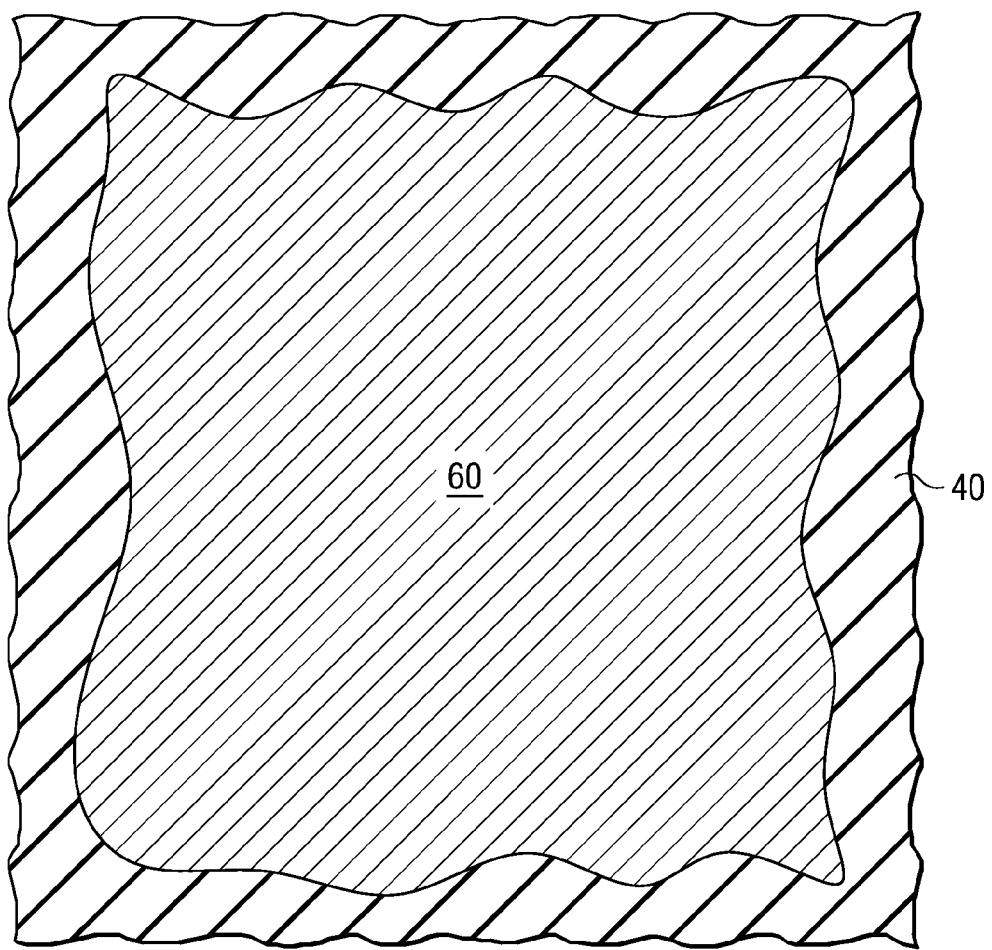

FIG. 1*e* illustrates a magnified top view of the bonding pad 60. Similar to the cross sectional view of FIG. 1*d*, the top view also comprises coarse features and edges. For example, the line edge roughness of the bonding pad 60 is much poorer than that achievable by conventional lithography techniques. In one embodiment, the line edge roughness as measured as a statistical distribution (e.g., a normal distribution) comprises a 1 sigma that is more than about 1000 nm. In an embodiment, the coarseness of the edges of the bonding pad 60 is about 1000 nm.

As illustrated in FIG. 1*a*, the second metal line 35 connects with the third via 50. However, as the cross section of the via is much smaller than the bonding pad, only an area about the size of the cross section of the via is required to contact the second metal lines 35. The metal level for the second metal lines 35 comprises additional area between the third vias 50 (area under the bonding pad 60). The additional area between the third vias 50 can be used for improved routing of the second metal line 35.

Although only two metal levels (first and second metal lines 25 and 35) are shown, various embodiments may comprise additional metal levels.

FIG. 2 illustrates cross sections of a portion a chip comprising bond pads formed in accordance with embodiments of the invention.

Figure 2A:
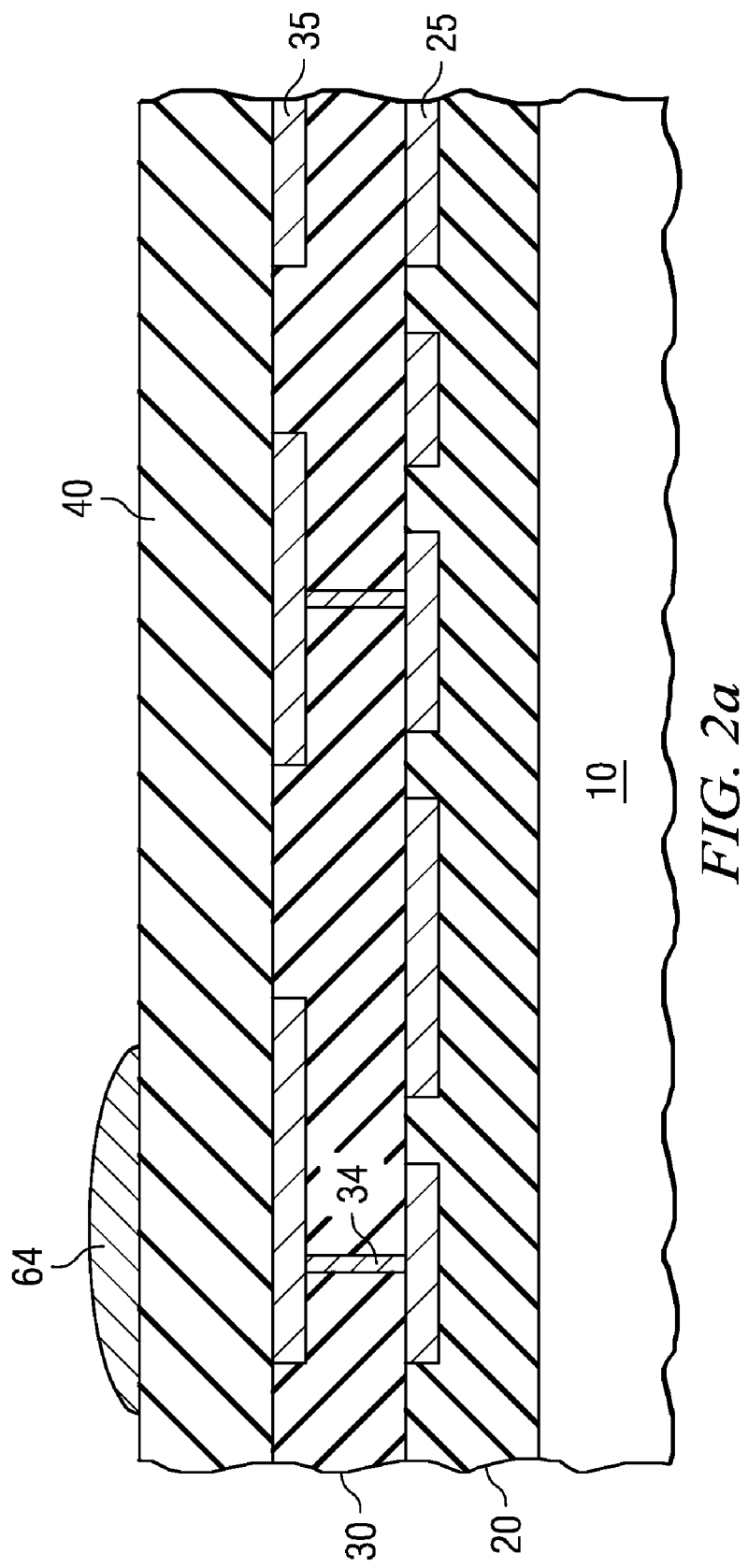
Figure 2B:
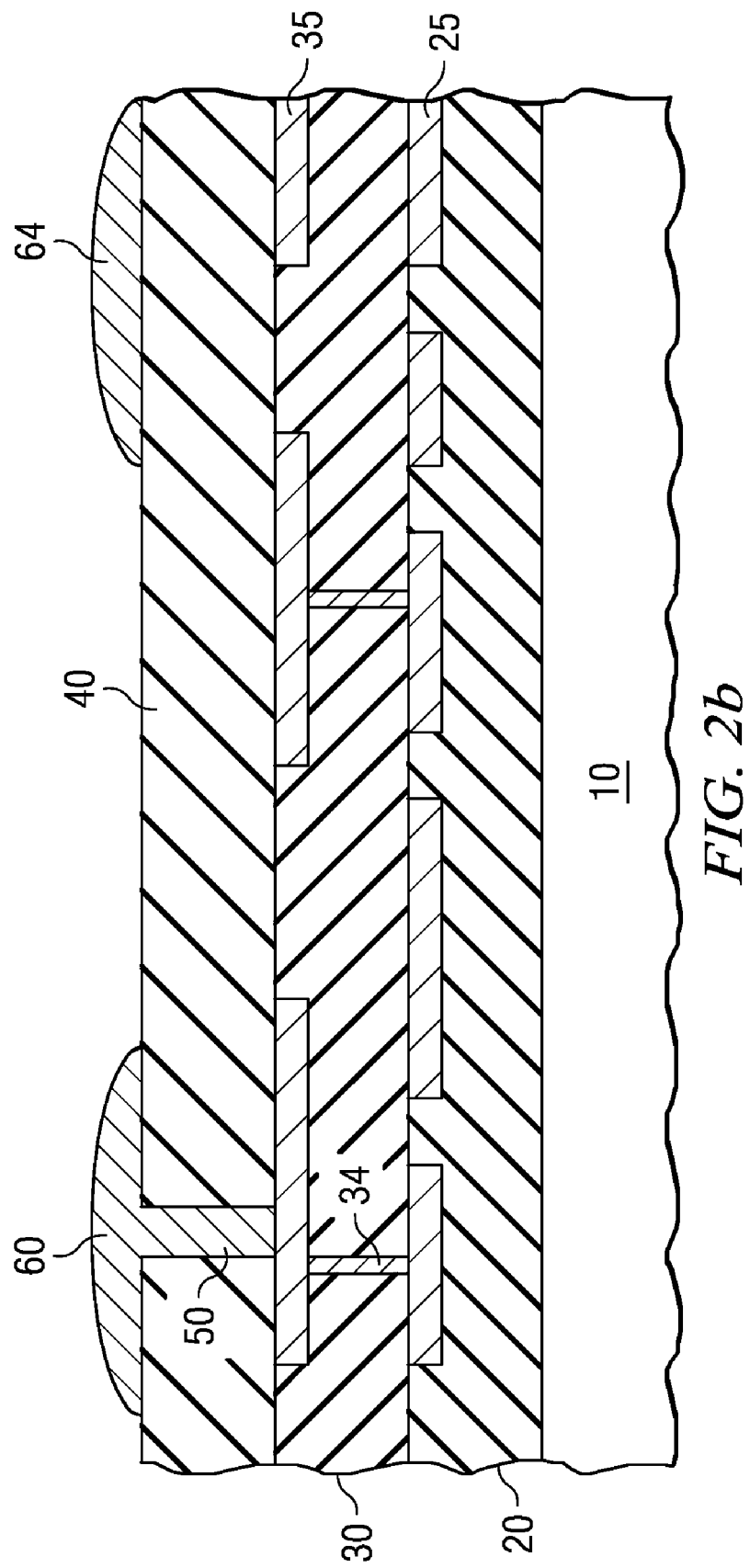

Referring to FIG. 2*a*, the undiced semiconductor component comprises the first and second metal lines 25 and 35 disposed in the first and second dielectric layers 20 and 30, respectively. The passivation layer 40 covers the top surface of the second dielectric layer 30. A structured mechanical bond pad (dummy bond pad 64) is disposed above the passivation layer 40, the dummy bond pad 64 being formed by embodiments of the invention described below. The dummy bond pad 64 in various embodiments is used as a support structure for the chip or for wire bonding loops, etc. The embodiment illustrated in FIG. 2*b* illustrates both the dummy bond pad 64 and the bond pad 60 that electrically couples to the last metal level via the third via 50. In some embodiments, the dummy bond pad 64 may be electrically set at a potential e.g., electrically grounded.

FIG. 3 illustrates further structural embodiments of the bond pads and illustrates top cross sections of a portion of an undiced semiconductor component comprising bond pads in accordance with embodiments of the invention.

Figure 3A:
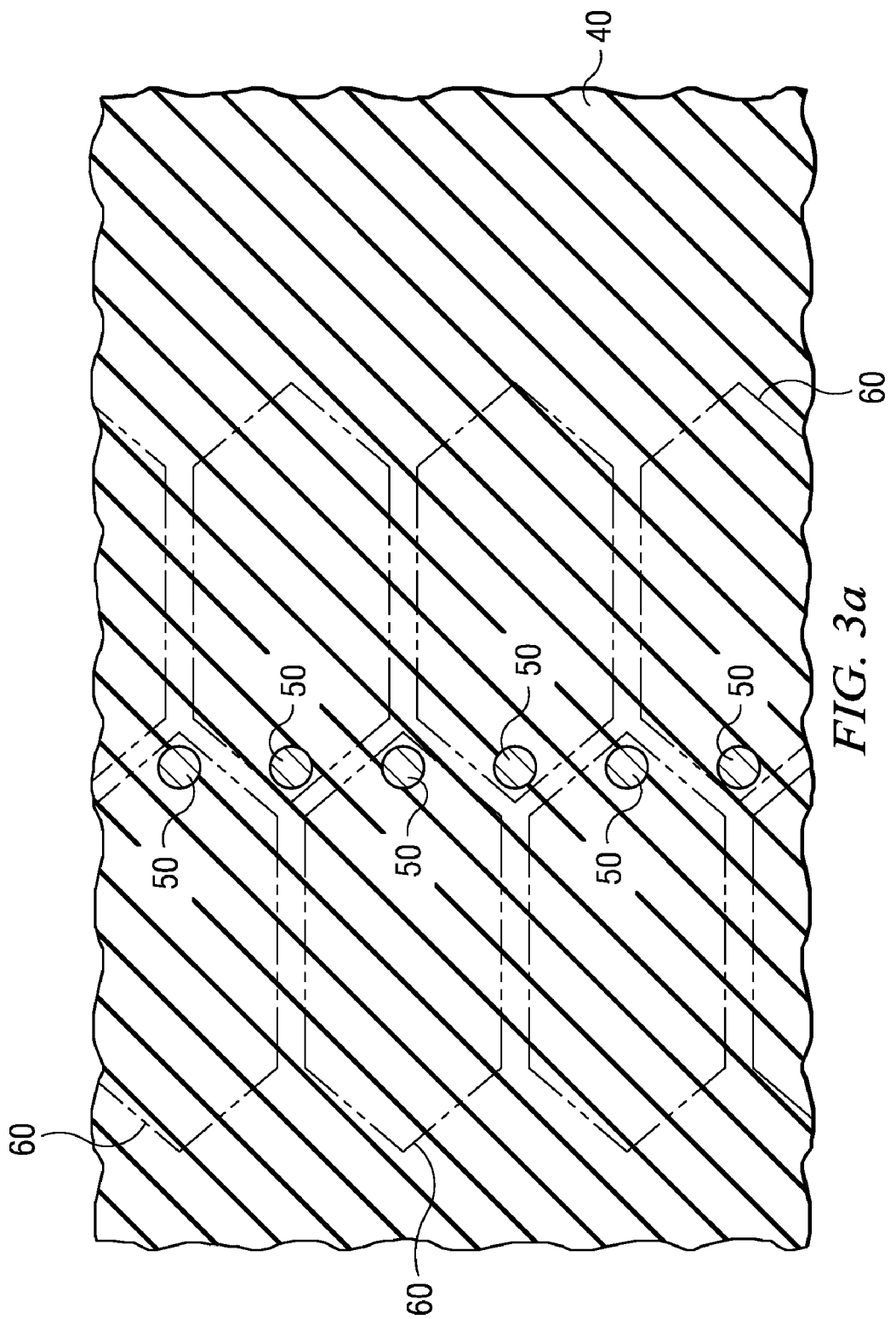
Figure 3B:
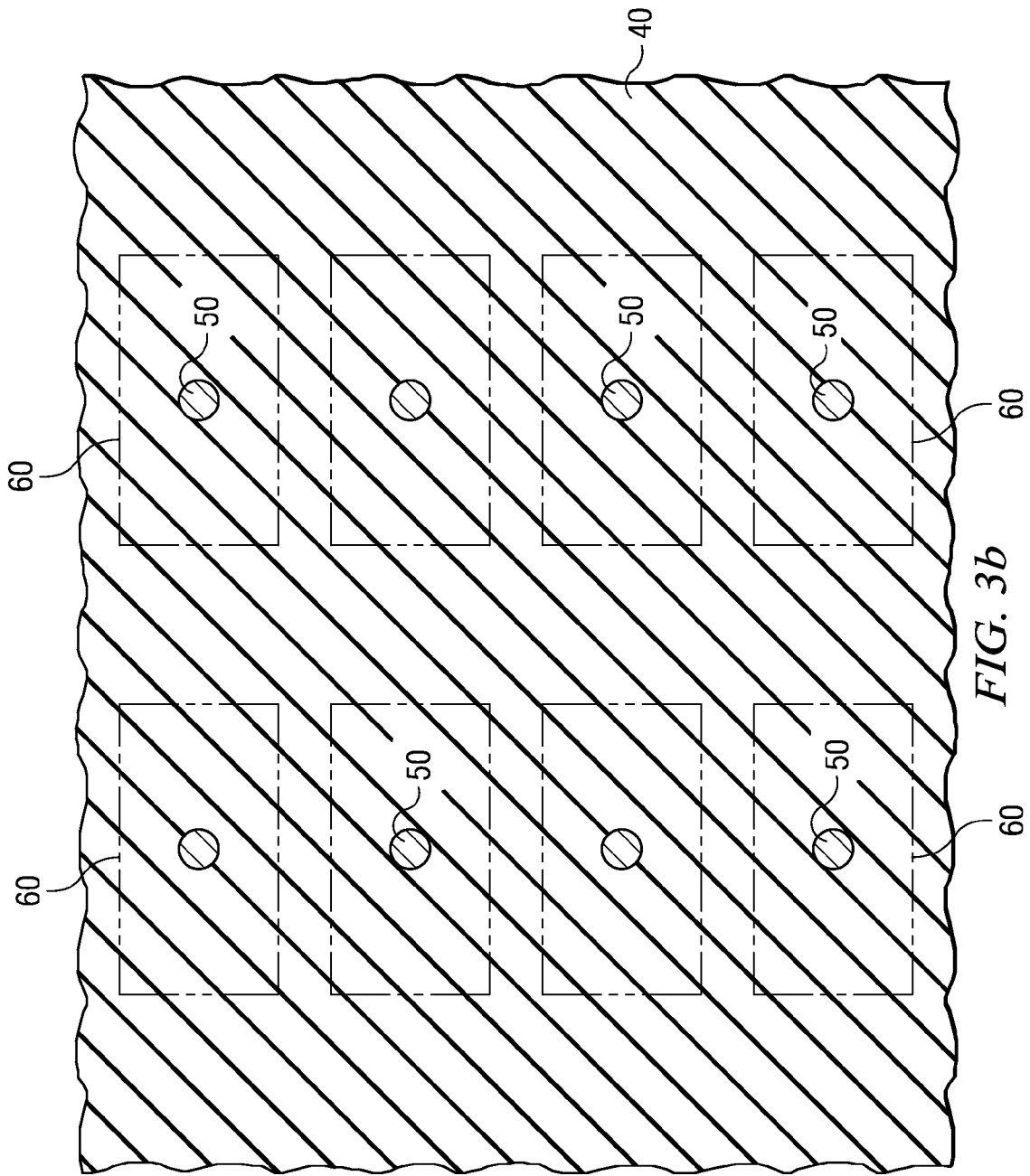

FIG. 3*a* illustrates an embodiment comprising double rows of bond pads. However, with the additional saving in area, the third vias 50 connecting the bond pads 60 (illustrated as dashes lines) to the second metal lines 35 (see FIG. 2*a*) are aligned in a single row. For example, in FIG. 3*a*, the bond pads 60 are staggered to allow the alignment of the third vias 50 in a single row. Significant chip area is saved by placing the bond pads 60 together. Although the use of double rows of third vias 50 may be avoided in some embodiments, other embodiments may include a double pad row design with dual rows of third vias 50 as illustrated in FIG. 3*b*.

Figure 3D:
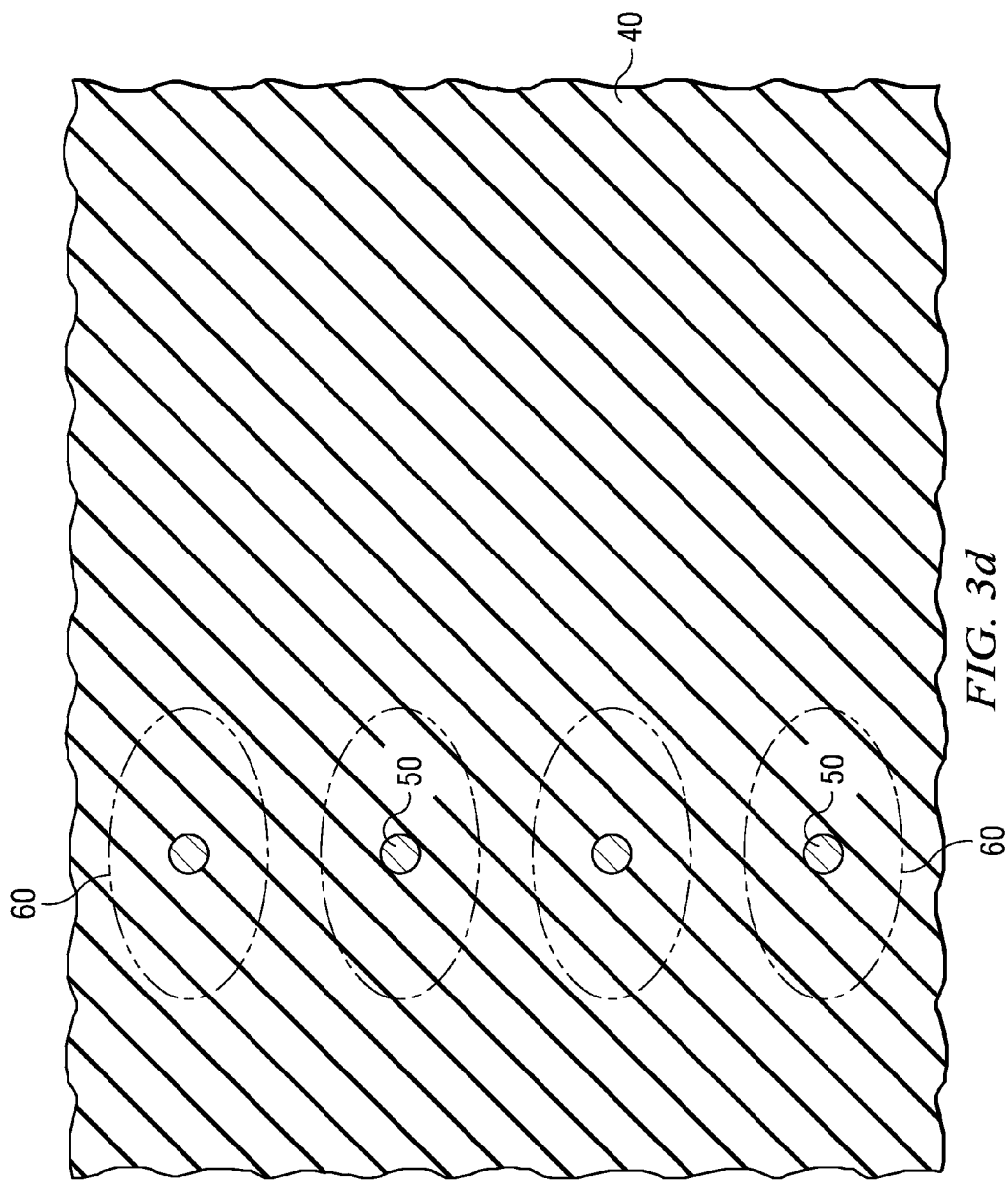
Figure 3E:
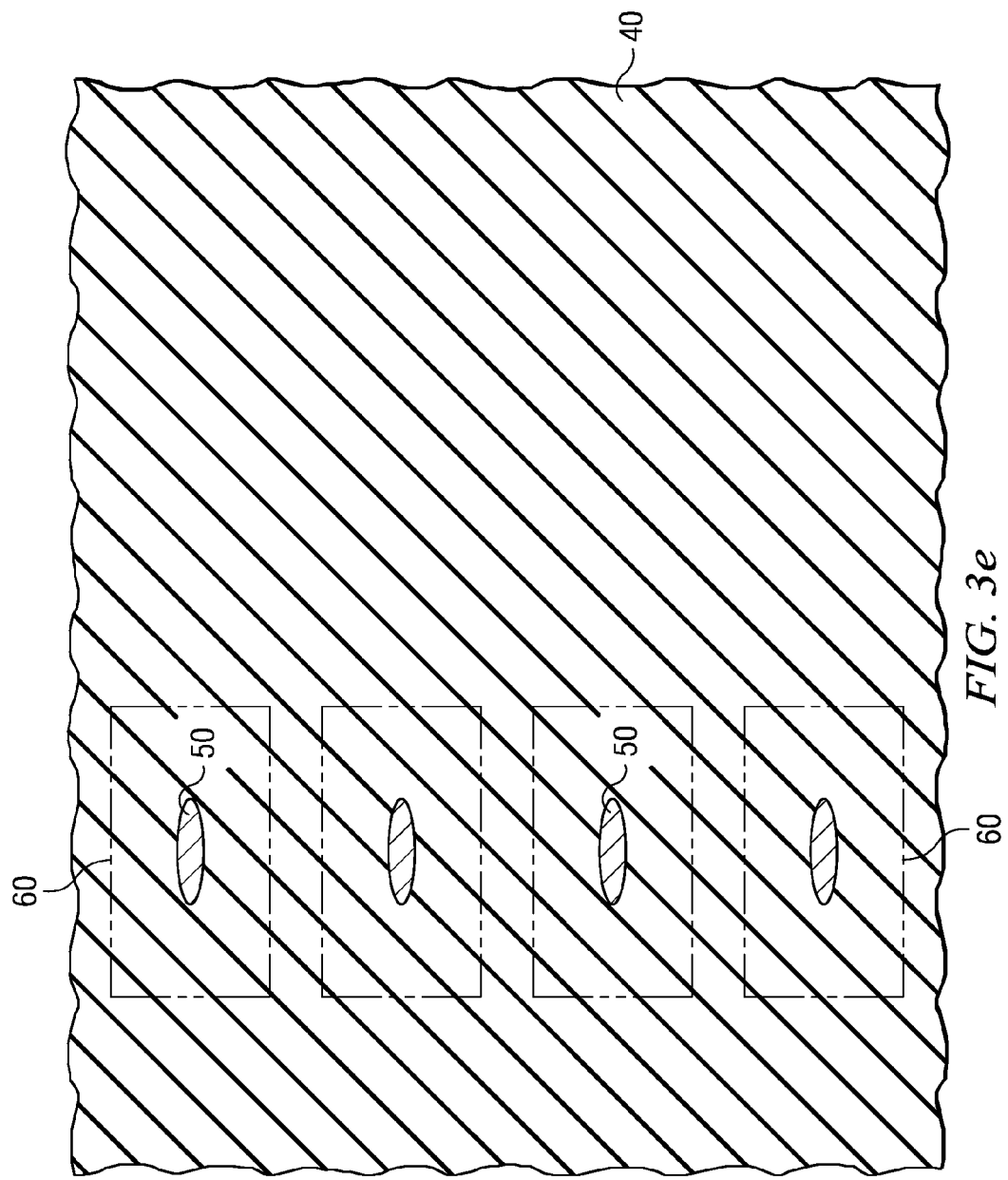

In various embodiments, as illustrated in FIG. 3*c*, the bond pads 60 and the third vias 50 are aligned in double rows. Although illustrated in a staggered design, the bond pads 60 and the third vias 50 may not form a staggered design in some embodiments. Unlike the square bond pads 60 illustrated in FIG. 1*c*, FIG. 3*d* illustrates rounded bond pads 60 formed in a row. Similarly, in different embodiments, suitable shapes for the third vias 50 may be used. For example, FIG. 3*e* illustrates trench-like third vias 50, for example, to increase area for routing metal lines in the horizontal direction. In other embodiments, other suitable shapes may be used for the third vias 50.

Figure 4A:
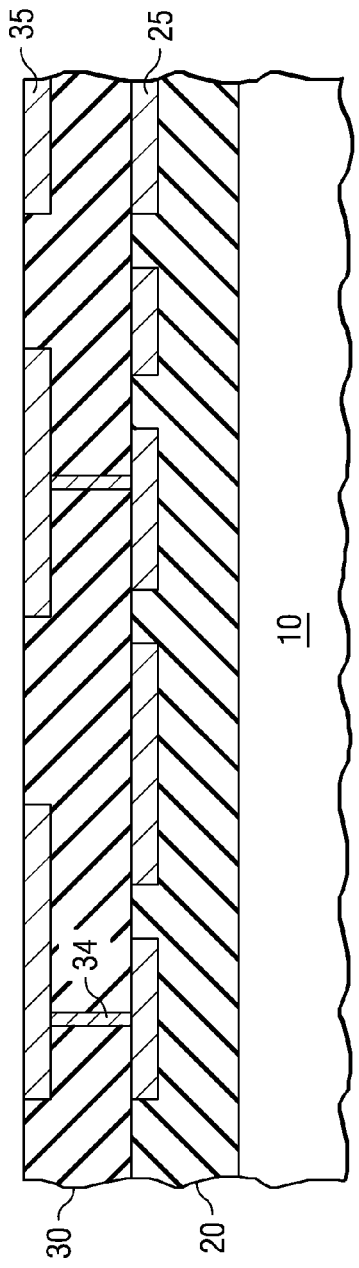
Figure 4B:
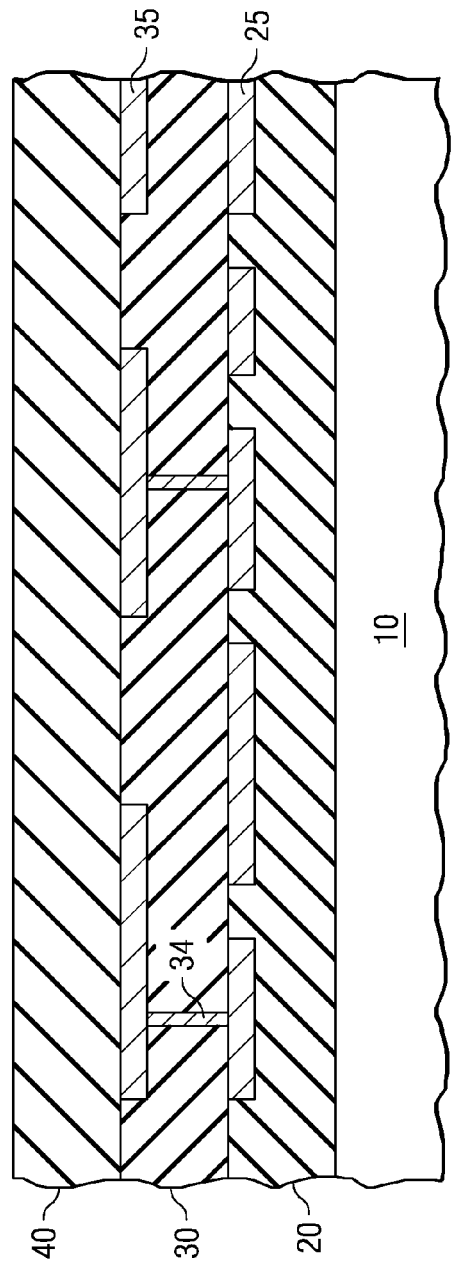
Figure 4E:
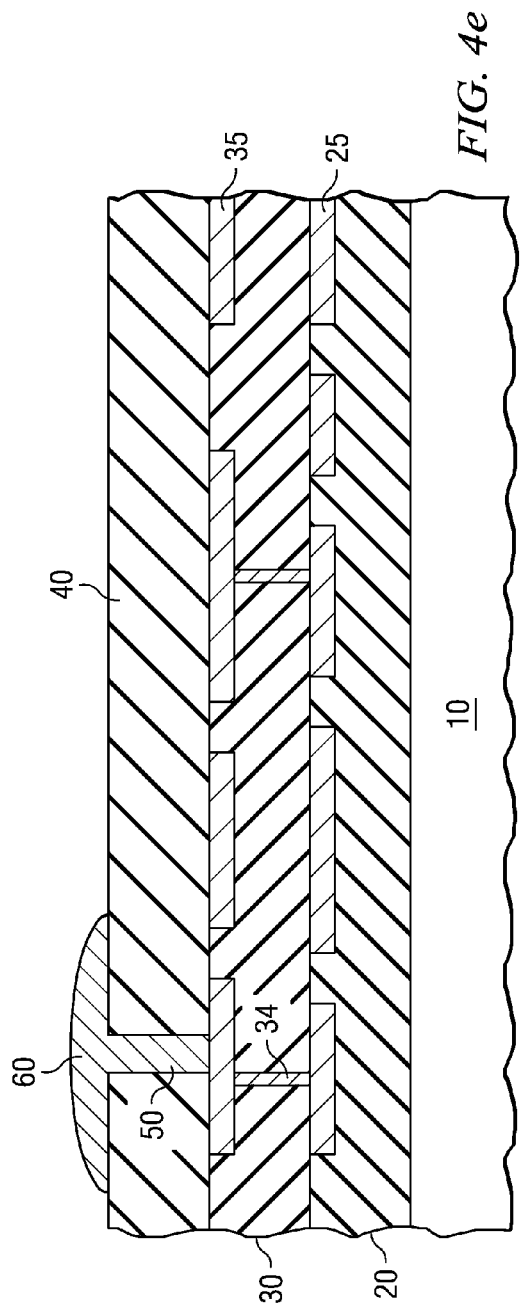
Figure 5:
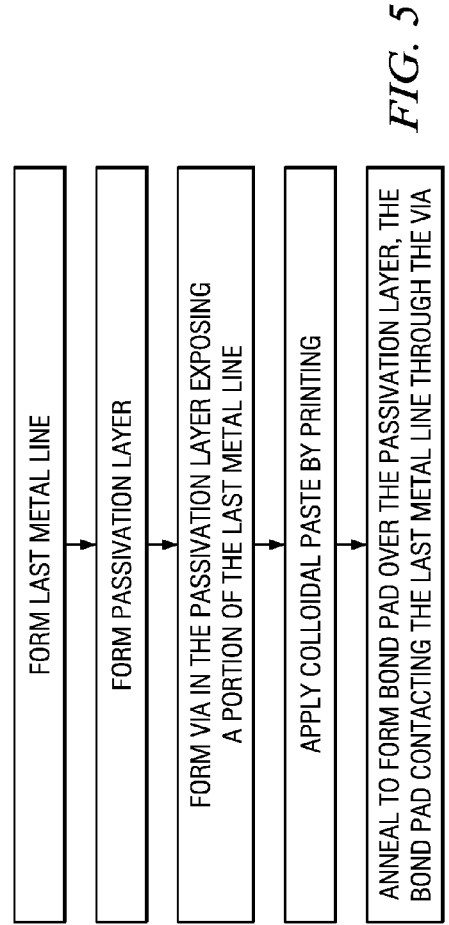
FIG. 5 illustrates a flow chart of a method of forming the bond pad, in accordance with an embodiment of the invention illustrated in FIG. 4.

A method of fabricating the bond pads is now described in FIG. 4 and in the flow chart of FIG. 5, in accordance with an embodiment of the invention. FIG. 4 illustrates a cross section of a portion of a semiconductor component during various stages of fabrication of the bond pads and/or dummy bond pads.

Referring to FIG. 4*a*, a portion of an undiced semiconductor component comprising the substrate 10 is illustrated after fabricating the last metal line. The last metal line is fabricated when the electrical circuits are functionally operational. For example, in a memory chip, the last metal line may be the second metal level. However, in other embodiments the last metal line may comprise a higher metal level, e.g., nine in one embodiment. The substrate 10 illustrated in FIG. 4*a* is a silicon wafer. The first and second dielectric layers 20 and 30 comprise the first and second metal lines 25 and 35, respectively. The first and second metal lines 25 and 35 are connected by second vias 34. First vias or plugs (not shown) connect the first metal lines 25 to the active devices on the substrate 10.

As illustrated in FIG. 4*b*, a passivation layer 40 is deposited over the last metal line (second metal lines 35). In some embodiments, an optional liner (not shown) is deposited over the last metal line before the deposition of the passivation layer 40. The optional liner may comprise, for example, a nitride material. The passivation layer 40 is typically an oxide layer. In other embodiments, the passivation layer 40 may comprise FTEOS, SiN, SiCOH, or other low-k materials. In one embodiment, the passivation layer 40 is a self-planarizing material, for example, coated over the substrate 10 using a spin-on glass. In other embodiments, the passivation layer 40 is deposited using a deposition process such as vapor deposition, chemical vapor deposition, or other deposition processes. An additional cap layer (not shown) may be formed over the passivation layer 40 in some embodiments. The passivation layer 40, and if present the optional liner and the additional cap layer, form a protective layer over the second metal lines 35 (last metal line), and prevent environmental degradation of the metal lines and active devices and circuitry.

Referring to FIG. 4*c*, the passivation layer 40 is patterned using a lithographic process to form an opening 41. A photo resist layer (not shown) is deposited over the passivation layer 40. The photo resist layer is exposed using a lithographic process and patterned. Using the patterned photo resist layer as a mask, the passivation layer 40 is etched anisotropically forming an opening 41 in the passivation layer 40. The anisotropic etch of the passivation layer 40 may in different embodiments be performed using a reactive ion etching. In some embodiments, the anisotropic etch may be stopped on the optional liner (if present). Subsequently, the optional liner is removed using a wet etch chemistry. The opening 41 exposes the last metal line, the last metal line being the second metal line 35 in this case.

In various embodiments, the openings 41 comprise holes in the passivation layer 40 with diameters ranging from about 2 µm to about 20 µm. In other embodiments, the openings 41 may comprise trenches or other suitable shapes. For example, in one embodiment, the openings 41 are designed parallel to the second metal lines 25 to enhance filling of the openings 41 during the subsequent printing processes. In some embodiments, longer and/or wider openings may also be used to minimize resistances.

Referring to FIG. 4d, a colloid 43 is printed over the wafer. The printing process in various embodiments comprises a non-lithographic process. Examples of the printing process include stencil printing, ink jet printing, electrostatic printing, and combinations thereof. The printing process fills the openings 41 in the passivation layer 40 with the colloid 43. In one embodiment, the colloid 43 forms a droplet over the opening 41 as illustrated in FIG. 4d.

In various embodiments, the colloid 43 is a liquid comprising nano-particles dispersed in a solvent. The nano-particles comprise conductive materials, for example, pure metals, metal alloys, metallic compounds, or intermetallics, for example, conductive solid solutions comprising one or more non metals. Examples of such non metals include silicon, carbon, germanium, oxygen and nitrogen. In various embodiments, the nano-particles comprise a metal such as copper, aluminum, gold, platinum, titanium, tantalum, chromium, nickel, cobalt, vanadium, and/or tungsten, and/or combinations thereof.

In various embodiments, the distribution of the nano-particles in the colloid 43 comprises a statistical distribution such as Gaussian, bimodal, or log normal with mean particle diameters of about 1 nm to about 50 nm. In one embodiment, the distribution of nano-particles comprises a mean diameter of about 5 nm. In various embodiments, the mean diameter of the nano-particles is selected to be at least 100 times smaller than the minimum dimension (e.g., width) of the openings 41.

In various embodiments, the variance of the distribution of the nano-particles is controlled to minimize uneven filling of openings 41. The variance is an important control parameter to minimize yield losses associated with partial filling of the openings 41. Hence, in various embodiments, the variance of the distribution of the particle diameters is much smaller than the minimum dimension of the openings 41.

The nano-particles are dispersed in a liquid forming the colloid 43 with suitable physical and chemical properties. For example, in various embodiments, the colloid 43 comprises suitable wettability and viscosity to completely fill the openings 41. In one embodiment, the wettability and interface tensions of the colloid 43 are chosen so that the colloid 43 comprising the nano-particles is drawn into the openings 41 by capillary action, minimizing, for example, yield loss due to non-filling of the openings 41 and/or printing misalignment errors.

Referring to FIG. 4e, the wafer is annealed to form a conductive bond pad 60 and a conductive third via 50. The droplet of the colloid 43 formed over the opening 41 forms the conductive bond pad 60. During annealing, the nano-particles sinter together (aggregate or coalesce to minimize surface energy). However, unlike other interconnect forming processes that require high temperatures, sintering processes driven by their high surface area and hence energies advantageously require lower anneal temperatures. The sintering temperatures are thus much lower than the melting temperatures required by other processes. Consequently, low thermal budgets can be adopted that minimize degradation of front and back end of the line structures, e.g., metal lines or low-k insulators. For example, silver nano-particles comprising particles of about 5 nm can be sintered at temperatures of about 200° C. to about 250° C. In various embodiments, the nano-particles are sintered at about 100° C. to about 300° C. The sintering or anneal temperature can be further lowered by reducing the particle sizes of the distribution.

Some embodiments may also use nano-particles comprising a low melting eutectic, for example, comprising lead and tin such as eutectic 63 Pb/37 Sn (63/37) with a melting temperature of about 183° C. Other embodiments may comprise combinations of nano-particles. In one embodiment, the nano-particles may comprise low melting eutectic nano-particles and pure metal nano-particles and/or metal alloy nano-particles. Such combinations may be used to maximize or optimize physical, mechanical and electrical properties. In another example, in one embodiment, a low melting eutectic and a high melting eutectic may be combined. The low melting eutectic coalesces with the higher melting eutectic forming the conductive pathway. In some embodiments, the higher melting eutectic may be formed during subsequent processing, for example, during formation of solder balls.

In different embodiments, the density of the sintered conductive material is improved if a higher sintering temperature is used. Some embodiments may improve the density of the sintered conductive material by increasing the pressure on the colloid 43 during the sintering process. In different embodiments, this may be achieved by using different techniques including increasing the chamber pressure, or applying direct pressure physically. For example, in some embodiments, a two step process may be used wherein the pressure is applied after a partial sintering of the colloid 43.

In various embodiments, after forming the bond pads 60 (and, if needed, additional dummy bond pads), a die is subsequently fabricated by grinding and dicing the wafers.

Figure 6A:
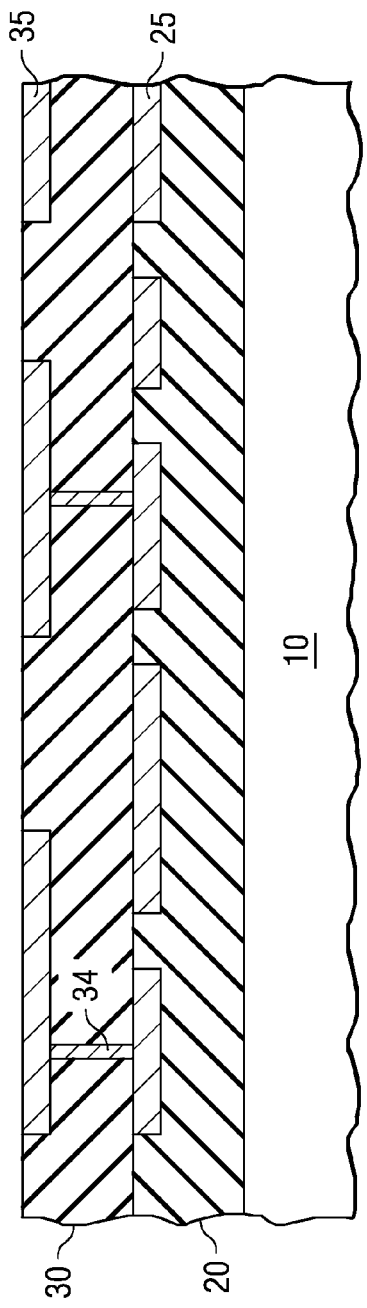
Figure 6B:
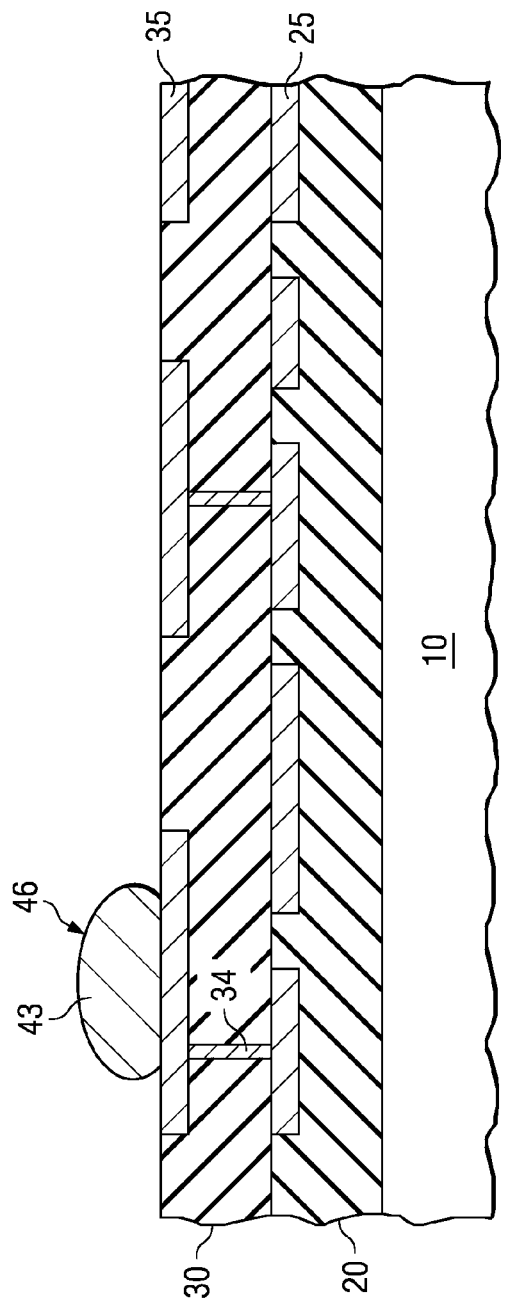
Figure 7:
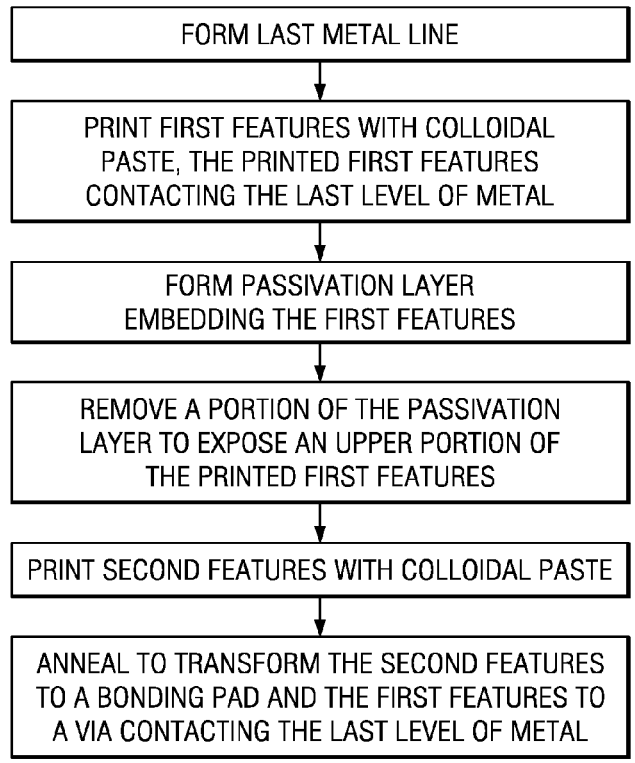
FIG. 7 illustrates a flow chart of a method of forming the bond pad, in accordance with an embodiment of the invention illustrated in FIG. 6.

A method of fabricating the bond pads is now described in FIG. 6 and in the flow chart of FIG. 7, in accordance with an embodiment of the invention. FIG. 6 illustrates a cross section of a portion of a semiconductor component during various stages of fabrication of the bond pads and/or dummy bond pads.

Referring to FIG. 6a, and as described with respect to FIG. 4a, a portion of an undiced semiconductor component comprising the substrate 10 is illustrated after fabricating the last metal line.

Referring to FIG. 6b, a colloid 43 comprising a nano-paste is printed over the wafer to form first features 46. The printing process in various embodiments comprises a non-lithographic process as described with respect to FIG. 4d. Examples of the printing process include stencil printing, ink jet printing, electrostatic printing, and combinations thereof. The first features 46 are formed over the last level of metal lines, for example, in this case over second metal lines 35. In various embodiments, the first features 46 are formed such that upon annealing they are transformed into third vias 50.

As illustrated in FIG. 6c, a passivation layer 40 is deposited over the last metal line (second metal lines 35). The passivation layer 40 completely covers the first features 46. In various embodiments, the passivation layer 40 is deposited using processes such as spin coating or spray coating.

Referring to FIG. 6d, the passivation layer 40 is partially etched to expose the first features 46, using, for example, a plasma etch and/or a cleaning step. As illustrated in FIG. 6e, the colloid 43 is printed again and comprises second features 47. The second features 47 comprise larger dimensions than the first features 46. This is because the second features 47 are targeted to form the bonding pads 60 upon annealing. The colloid 43 is printed using techniques described with respect to FIG. 4d, including stencil printing, ink jet printing, electrostatic printing, and combinations thereof.

Referring next to FIG. 6f, an anneal is performed to convert the first features 46 into third via 50 and the second features 47 into the bonding pad 60 as described in detail with respect to FIG. 4e. In different embodiments, a single anneal forms both the third via 50 from the first features 46 and the bonding pad 60 from the second features 47. However, in some embodiments, a separate anneal is performed at an earlier step to form the third via 50, for example, before or immediately after forming the passivation layer 40.

Figure 8A:
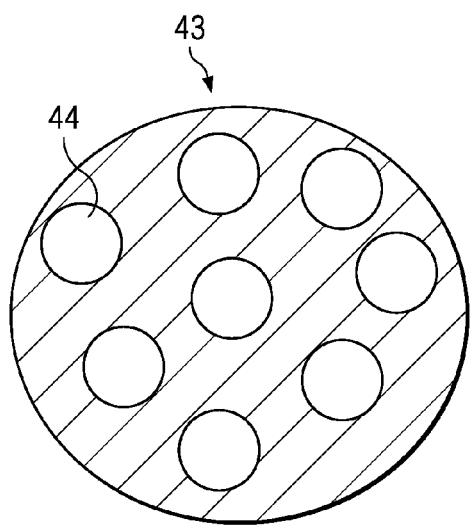
Figure 8B:
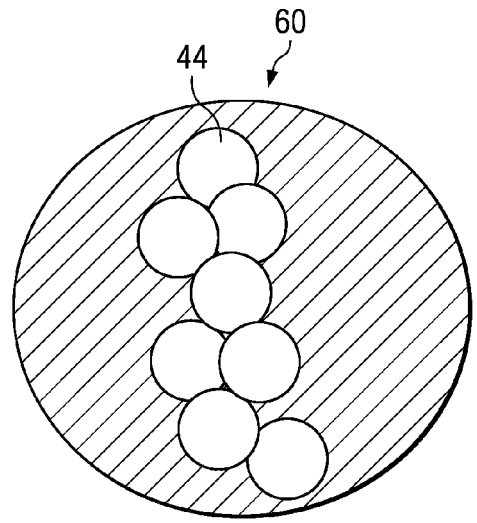

An embodiment of the invention illustrating the microstructure of the nano-particle distribution is described in FIG. 8, wherein FIG. 8a describes the microstructure of the colloid 43 after deposition on the passivation layer 40, and FIG. 8b describes the microstructure of the bond pad 60 and/or the third via 50 after the anneal.

Referring to FIG. 8a, the colloid 43 comprises nano-particles 44 dispersed in a medium. The medium comprises a liquid with suitable physical and chemical properties such that the nano-particles 44 remain in a dispersed phase, i.e., they do not coalesce together. In one embodiment, the medium comprises additives that, for example, create repulsion between the nano-particles 44. The microstructure of each individual nano-particle 44 may comprise different grain sizes, orientations and crystal structures depending, for example, on the composition and size of the nano-particles 44.

FIG. 8b illustrates the microstructure of the bond pad 60 after the sintering process. The medium is primarily evaporated and the forces holding the nano-particles 44 away from each other do not exist. Consequently, and with the energy provided by the anneal temperature, the nano-particles 44 are sintered or aggregated together forming a sintered conductive material. However, the sintered conductive material comprises a lower density than the density of individual nano-particles 44. This is primarily due to the large number of voids remaining after the evaporation of the solvent during the sintering process. In different embodiments, the voids may be reduced by increasing the sintering temperature and/or increasing the sintering pressure.

Figure 9A:
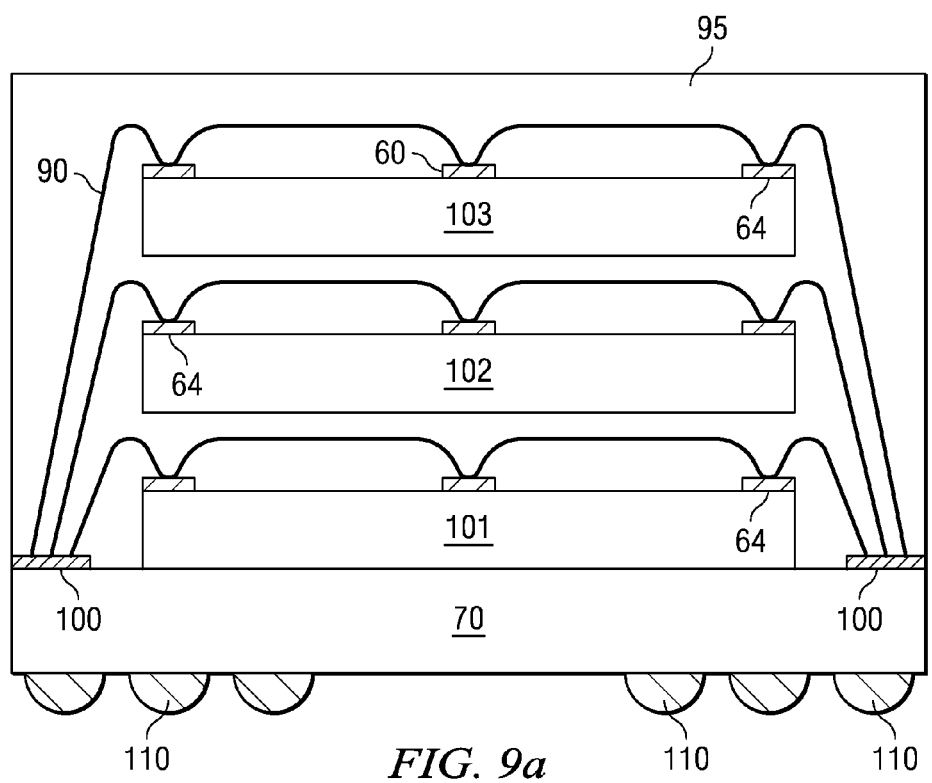
Figure 9B:
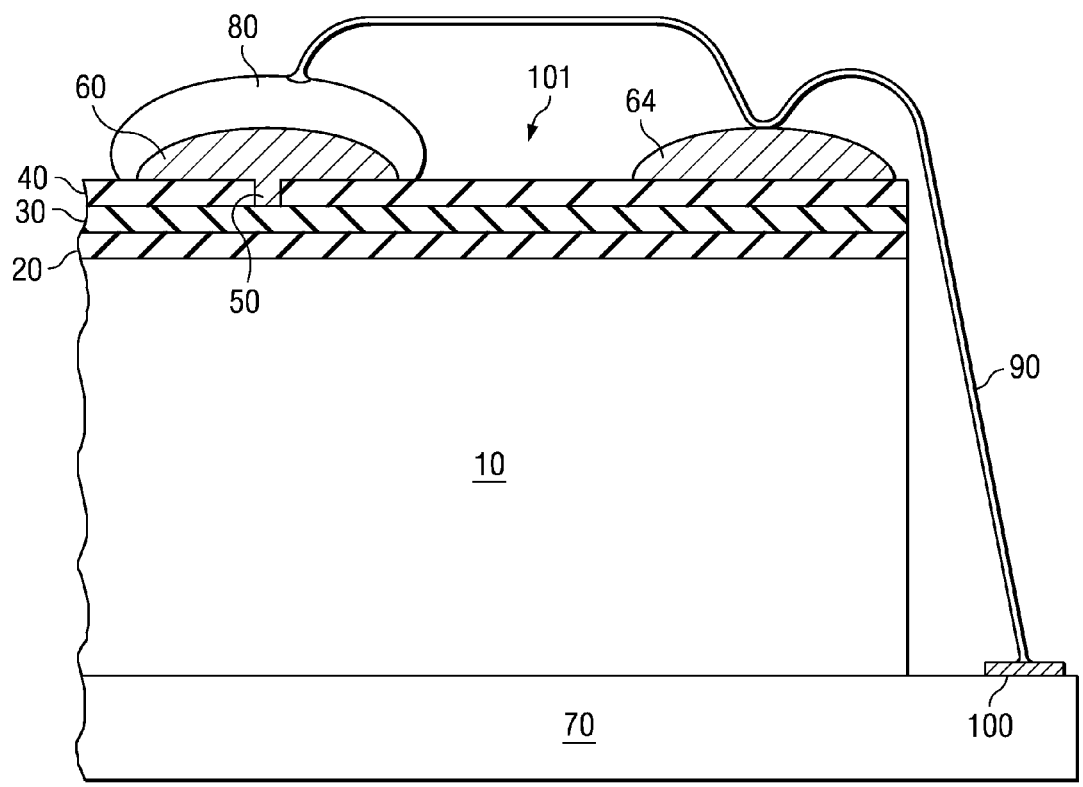
Figure 9C:
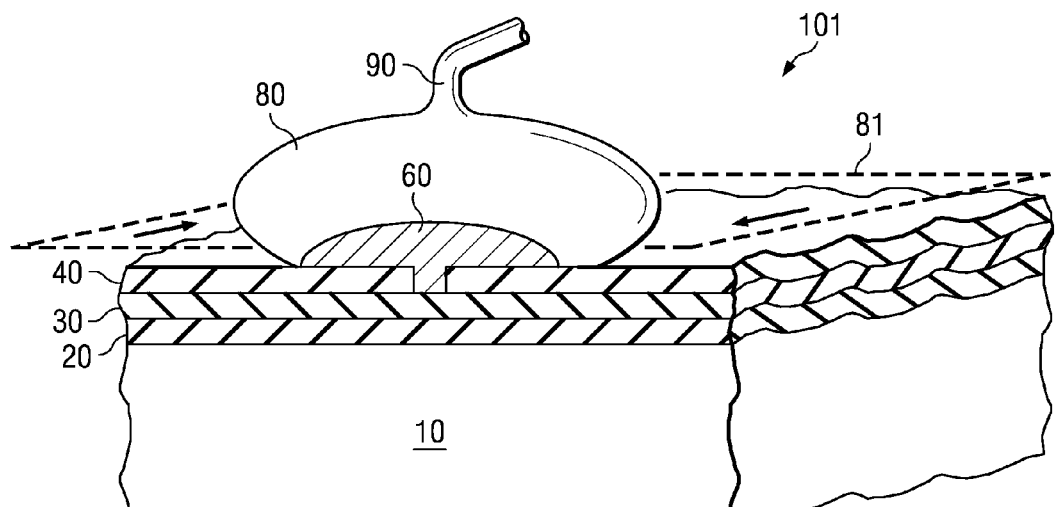

An embodiment of the invention describing a stacked wire bond package is described in FIG. 9, which includes FIGS. 9a-9c.

FIG. 9a illustrates a memory package comprising stacked memory dies. The memory package comprises a substrate or board 70 comprising board contacts 110. First, second and third memory dies 101, 102 and 103 are stacked over the board 70. Each of the first, second and third memory dies 101, 102 and 103 is coupled to board pads 100 on the board 70.

In some embodiments, the stacked dies 101, 102 and 103 are interconnected to the board 70 using wirebonding. However, wirebonding a complex lay-out of hundreds of microscopic wires challenges the fabrication and design process. As illustrated in FIG. 9a, the bond pads 60 for contacting the dies 101, 102 and 103 are located in the center. Hence, fabrication and design of the wirebonding loops 90 coupling the bond pads 60 and the board pads 100 is challenging. If the length of the wirebonding loop 90 exceeds a certain distance, additional mechanical supports are needed. In one embodiment, such mechanical supports comprise dummy bond pads 64 that support the loop frame. The dummy bond pads 64 are identical to the bond pads 60, but unlike the bond pads 60 do not electrically contact the underlying last metal line. In one embodiment, if the wirebonding loop 90 exceeds more than about 4 mm, additional dummy bond pads (not shown) are provided. Similarly, the wirebonding loops 90 are restricted because of the distance between the dies 101, 102 and 103, for example, the distance between first and second dies 101 and 102. The stacked dies 101, 102 and 103 are encapsulated in encapsulant 95.

The wirebonding loops 90 are illustrated in detail in FIGS. 9b and 9c. FIG. 9b illustrates the first memory die 101 disposed on the board 70, the wirebonding loops 90 coupling the bond pads 60 to the board pads 100. Wirebonding balls 80 are disposed on the bond pads 60 which are coupled to the wirebonding loops 90. The wirebonding balls 80 are supported on the edge of the die 101 by dummy bonding pads 64. Using dummy bonding pads 64 alleviates the challenges in wirebonding. Since the dummy bonding pads 64 are produced along with the bonding pads 60, they are inexpensive additions. For example, adding support structures using a conventional process can be expensive due to the expensive (additional) lithographic and thin film deposition processes needed.

Finally, FIG. 9c illustrates a magnified cross section of the wirebonding ball 80. As illustrated in one embodiment, the wirebonding ball 80 completely encapsulates the bonding pads 60, thus producing a mechanical contact with excellent properties. This is possible only because the bonding pads 60 are fully exposed along their sidewalls. The resulting contact is immune to failure arising from high stresses. For example, FIG. 9c illustrates the application of a shear stress (shown by arrows) on a plane 81. Unlike a contact bonded only from a top surface, the encapsulated contact comprises a higher immunity to shearing (fails at a higher shear stress than an unencapsulated contact).

Figure 10A:
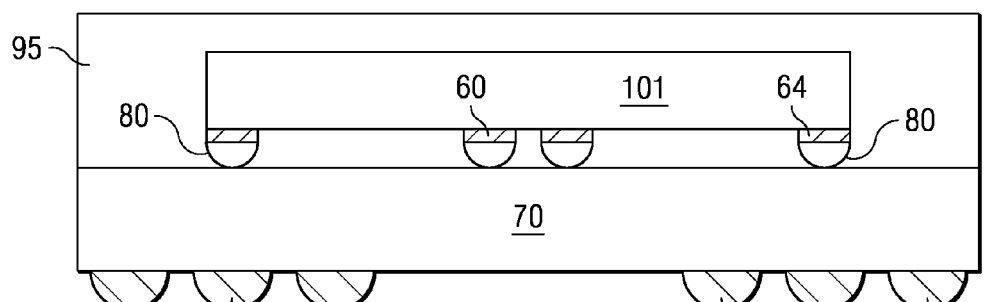
FIGS. 10a and 10b, illustrates an embodiment of a package including a flip chip, wherein FIG. 10a comprises a single row of bond pads, and FIG. 10b comprises a double row of bond pads.
Figure 10B:
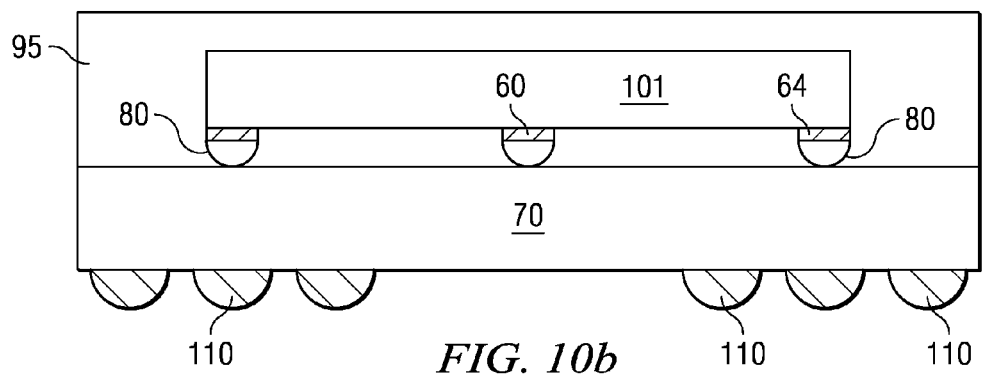

FIG. 10, which includes FIGS. 10a and 10b, illustrates embodiments of the invention relating to a flip chip package, wherein FIG. 10a illustrates a memory die with a double pad row design, and FIG. 10b illustrates a memory die with single pad row design. A first die 101 is stacked over a board 70 comprising board contacts 110. The first die 101 is coupled to the board 70 through bond pads 60 on the first die 101. Additional dummy bond pads 64 support the first die 101 along the edges. These additional dummy bond pads 64 stabilize the first die 101 during pick and place and reflow processes during the formation of the flip chip package. The dummy bond pads 64 in various embodiments are formed using processes described in various embodiments, and are hence advantageously produced at a low cost. For example, the presence of these mechanical supports can minimize handling and/or the cost of producing a supporting structure by other more expensive processes, and hence can significantly reduce production cost. In various embodiments, the printing of these dummy bond pads 64 minimizes restrictions in design of other components of the chip, e.g., the bond pads 60, which, for example, are no longer the only support structures. By eliminating the significant constraints during the production and design process, a simple and reliable flip chip bonding and reflow is achieved. Although illustrated on the edges, the dummy bond pads 64 may be formed in other regions in some embodiments.

Embodiments of the invention enable formation of smaller pads on a semiconductor die at a lower cost. In different embodiments, this savings in area can be utilized to reduce chip area, design complexity, cost, or combinations thereof. FIG. 11 illustrates one example of using this tradeoff.

Figure 11A:
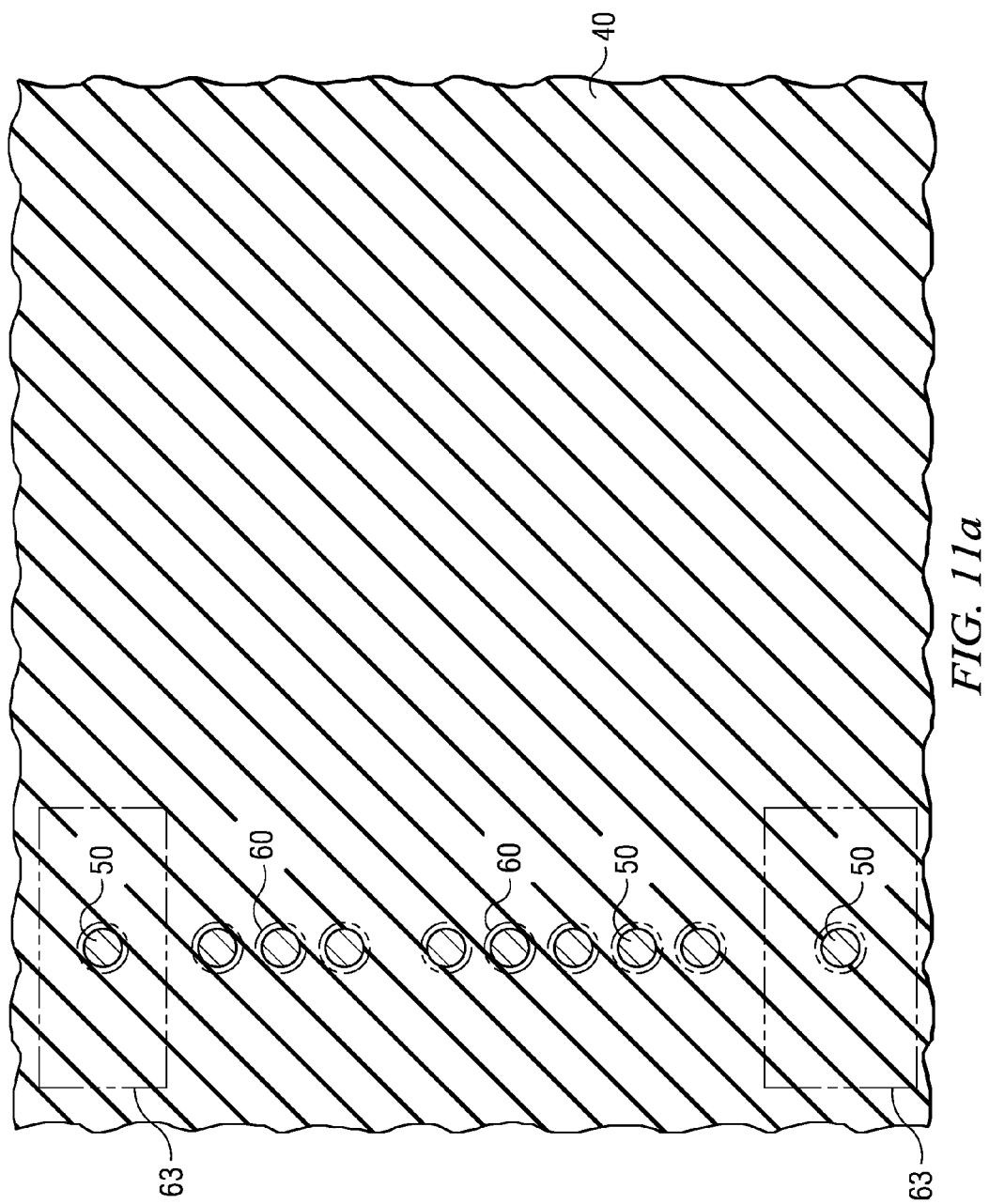
Figure 11B:
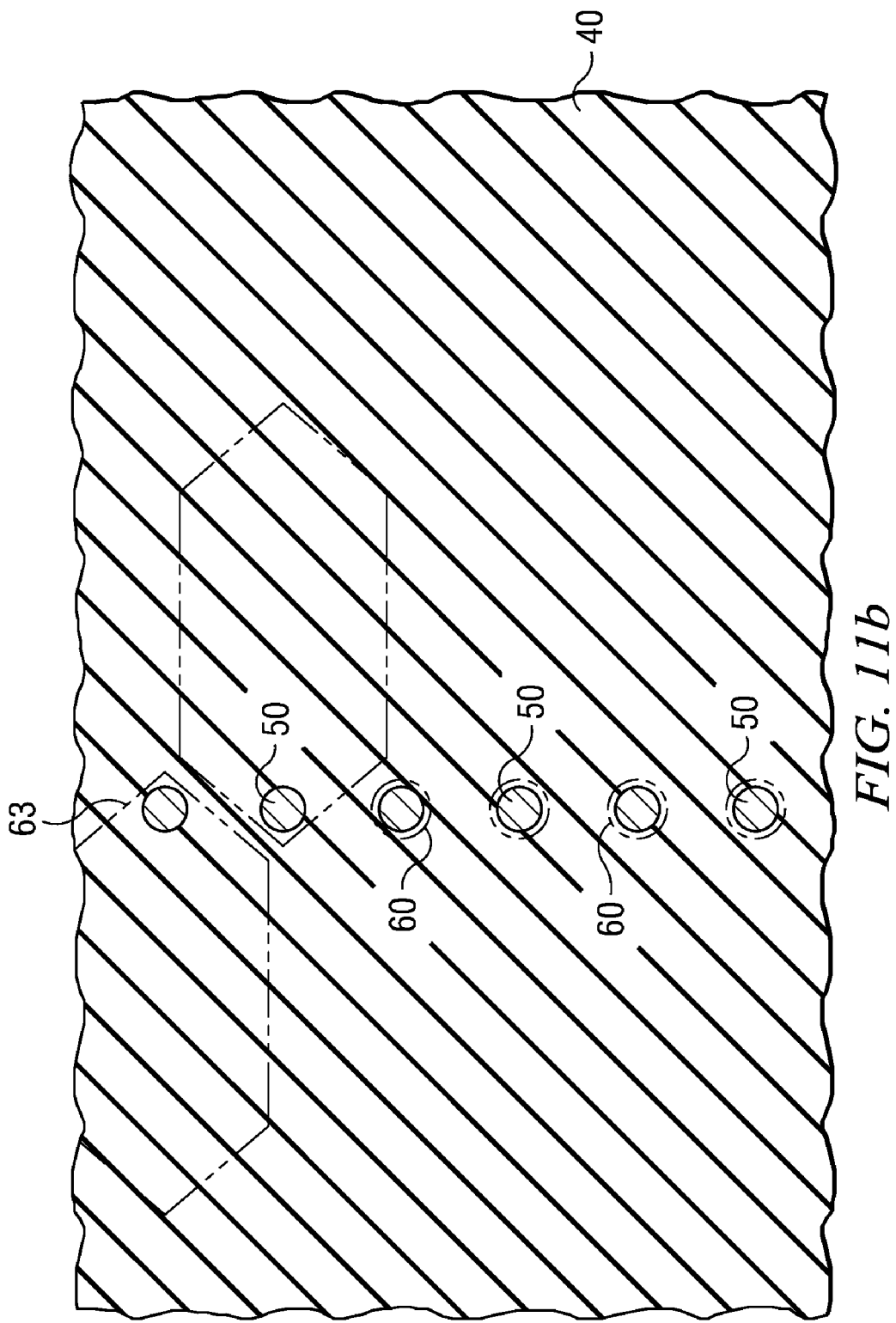
Figure 11C:
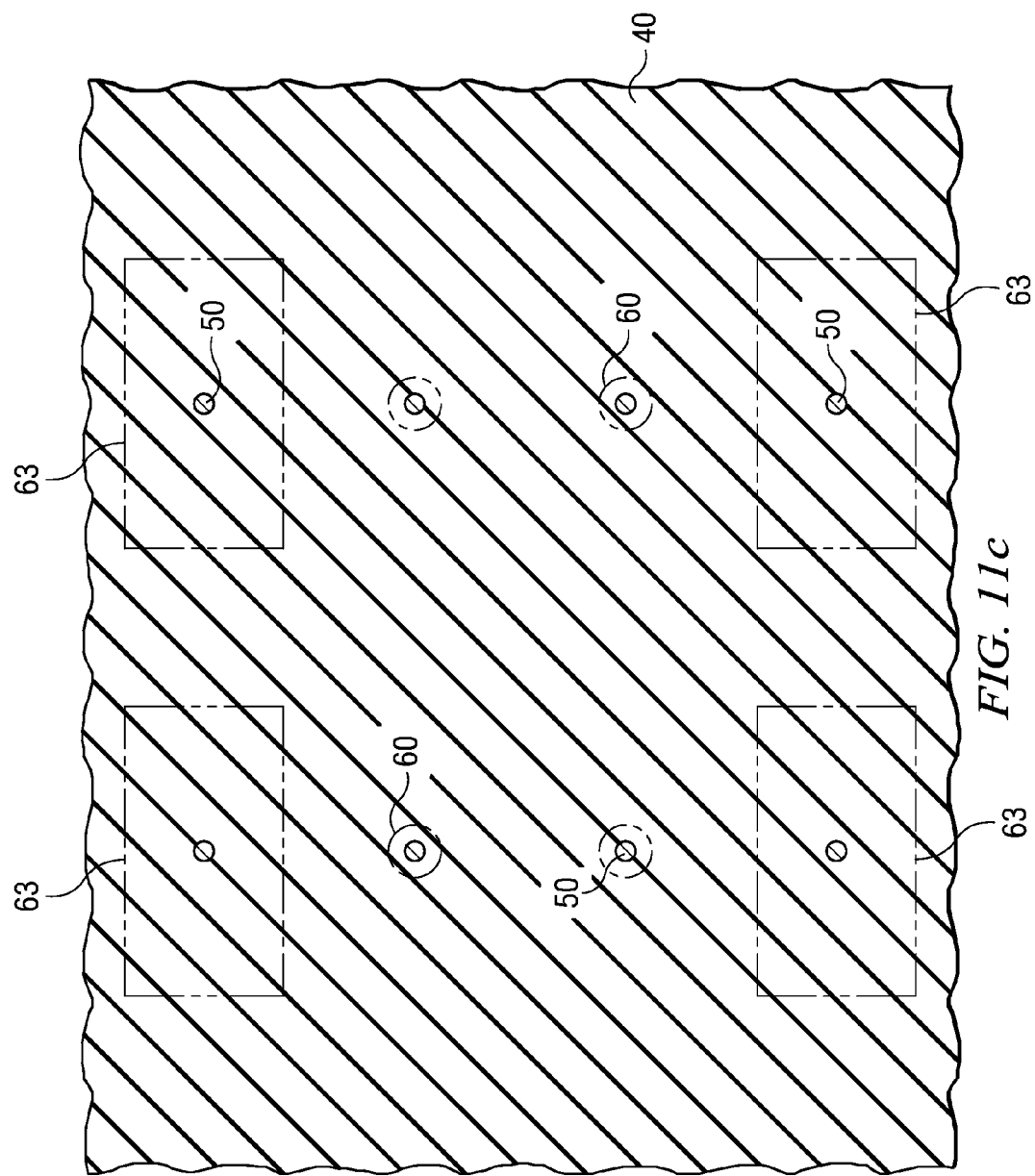
Figure 11D:
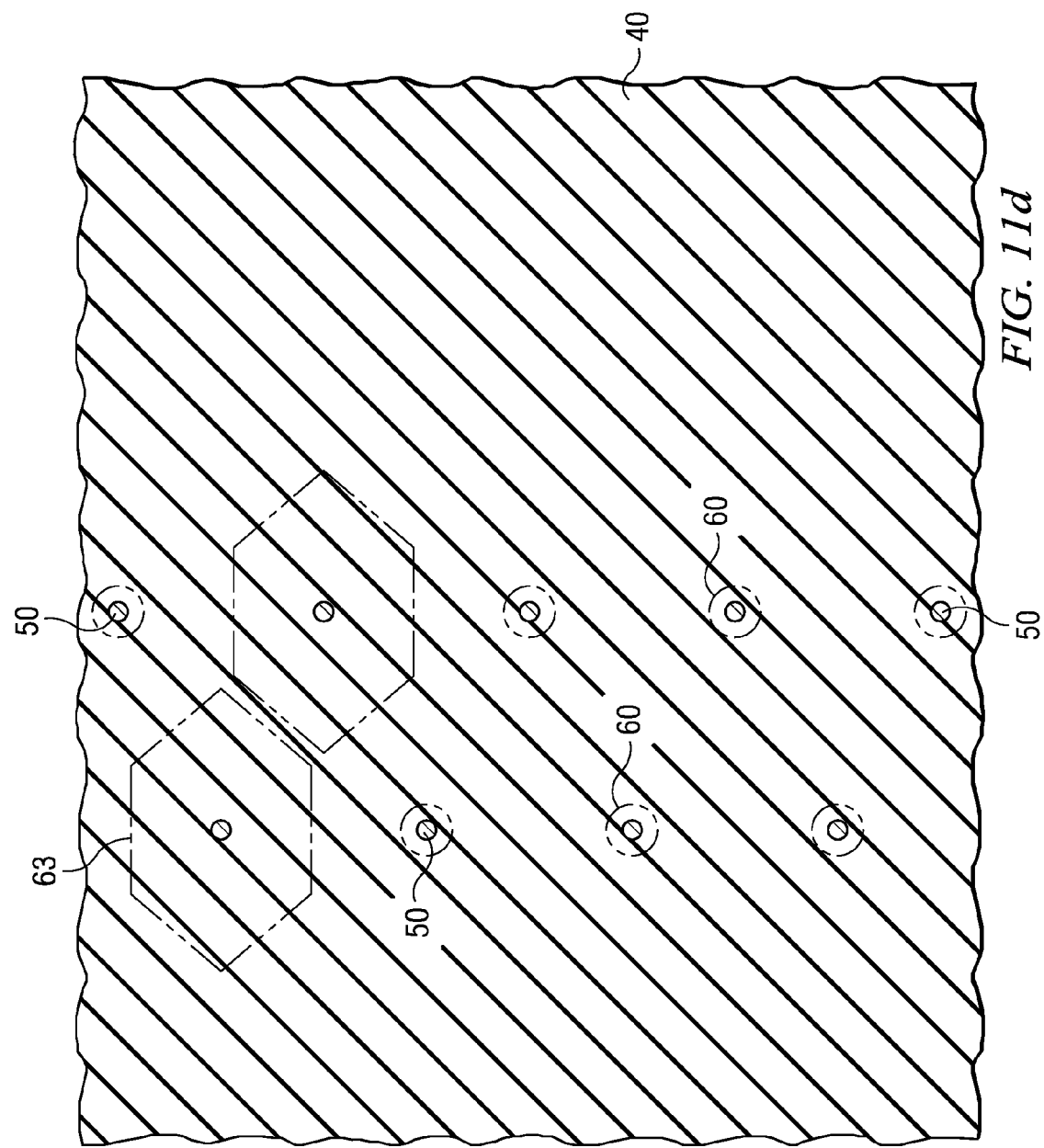

FIG. 11, which includes FIGS. 11a-11d, illustrates a further embodiment of the invention illustrating a design of the bond pads. FIG. 11a illustrates a single bond pad and test pad design, FIG. 11b illustrates a double row of test pads but a single row of bond pads, FIG. 11c illustrates a double row of bond and test pads, and FIG. 11d illustrates two rows of staggered bond and test pads.

In various embodiments, the pads comprise different sizes, e.g., based on functionality, number of connections, or other design parameters, such as bonding regions, etc. In one embodiment described in FIG. 11, the pads are differentiated based on their functionality. For example, pads on the memory die include bond pads for coupling to the board, and test pads used as a probe contact during subsequent testing of the die. In other embodiments, the bond pads are divided further based on the number of connections. For example, bond pads that require a larger number of connections comprise a larger size than bond pads that couple to only a few locations on the board.

Referring to FIG. 11a, the embodiment illustrates a single row of bond pads 60 (along a top cross section, for example, along line 1c of FIG. 1a). The bond pads 60 comprise a dimension that is about the dimension of the third vias 50 disposed underneath them. The memory die additionally comprises test pads 63 disposed above the last metal line (not shown), and also disposed above the passivation layer 40. While the bond pads 60 electrically couple to the board 70, the test pads 63 are used for testing, for example, as a probe contact. Hence, the area of the test pads 63 is much larger than the area of the bond pads 60. The number of test pads 63 required is lower and hence only a few larger test pads are formed relative to the large number of bond pads 60. In different embodiments, the third vias 50 are smaller than the bond pads 60. However, the bond pads 60 are significantly smaller than the test pads 63. The large difference in sizes of the test pads 63 relative to the bond pads 60 advantageously enables better wiring and routing of metal lines as well as easier and less restrictive design of these metal lines. In various embodiments, the ratio of the test pad area to that of the bond pad area is at least greater than 4:1. In one embodiment, this ratio is about 10:1. For example, in one embodiment, the area of the test pad 60 is greater than about 50×50 $\mu m^2$, whereas the area of the bond pad 63 is less than about 15×15 $\mu m^2$.

In different embodiments, the arrangement and size of the bond pads 60 and test pads 63 may be optimized. For example, in one embodiment, a double row of test pads 63 with a single row of bond pads 60 is used (FIG. 11b). FIG. 11c illustrates a double row of bond pads 60 and test pads 63, and FIG. 11d illustrates two rows of staggered bond pads 60 and test pads 63. Although not shown, in different embodiments, bond pads 60 and test pads 63 may each comprises pads of different sizes. In various embodiments, the pads are designed to leverage the ability to form pads of different sizes, shapes and configuration resulting in significant savings in complexity and area.

Although embodiments of the invention describe formation of bond pads, other features such as a redistribution layer may be formed in various embodiments. Although embodiments of the present invention are explained for forming bond pads, the embodiments of the invention apply to other features as well, in particular to wire bonding, wafer level, and embedded wafer level packages.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor component, the method comprising:
    depositing an insulating layer over a last metal line of a substrate;
    forming openings in the insulating layer;
    printing a colloid over the insulating layer, wherein the colloid fills the openings; and
    heating the colloid to form conductive vias and bond pads, wherein the conductive vias are disposed in the openings, and wherein the bond pads are disposed on the conductive vias.

2. The method of claim 1, wherein the colloid comprises dispersed nano-particles.

3. The method of claim 1, where heating the colloid forms dummy bond pads disposed on the insulating layer, wherein the dummy bond pads do not contact the conductive vias.

4. The method of claim 1, wherein heating the colloid comprises heating at a temperature of about 200° C. to about 250° C.

5. The method of claim 1, wherein the bond pads comprise a first cross sectional area, the conductive vias comprise a second cross sectional area, and a ratio of the first cross sectional area to the second cross sectional area is greater than about 20:1.

6. The method of claim 1, wherein printing the colloid over the insulating layer comprises printing with screen printing, ink-jet printing, electrostatic printing, and combinations thereof.

7. The method of claim 1, wherein, after heating the colloid to form the bond pads, the method further comprises:
    dicing the substrate; and
    grinding the substrate.

8. The method of claim 2, wherein the nano-particles comprise a diameter less than about 10 nm.

9. An interconnect structure comprising:
    a passivation layer disposed over a last layer of metal lines;
    a conductive via disposed in the passivation layer; and
    a bond pad disposed over the conductive via, wherein the conductive via electrically couples a portion of board pads with the last layer of metal lines, wherein the bond pad and the conductive via comprise sintered nano-particles.

10. The interconnect structure of claim 9, wherein the bond pad and the conductive via further comprise voids.

11. The interconnect structure of claim 9, wherein the sintered nano-particles comprise a metal or a combination of metals.

12. The interconnect structure of claim 9, wherein the sintered nano-particles comprise silver, copper, aluminum, platinum, nickel, tin, tantalum, titanium, lead, gold, or a combination thereof.

13. The interconnect structure of claim 9, wherein a density of the bond pad is less than a density of the nano-particles.

14. A semiconductor chip comprising:
bond pads disposed over last metal lines of a semiconductor die, the bond pads electrically coupled to the last metal lines, wherein the bond pads comprise connections for electrically coupling to a board; and
a first test pad and a second test pad disposed over the last metal lines, the first and second test pads electrically coupled to the last metal lines, wherein the first and second test pads do not comprise connections for electrically coupling to the board, wherein the bond pads are disposed between the first and second test pads, and wherein the first and second test pads are larger than the bond pads.

15. The semiconductor chip of claim 14, wherein an area of the first and second test pads is at least 10 times larger than an area of the bond pads.

16. The semiconductor chip of claim 14, further comprising:
first conductive vias disposed in a passivation layer, the first conductive vias disposed under the bond pads, wherein the passivation layer is an uppermost insulation layer of the semiconductor die, and wherein the first conductive vias electrically couple the bond pads to the last metal lines; and
second conductive vias disposed in the passivation layer, the second conductive vias disposed under the first and second test pads, wherein the second conductive vias electrically couple the first and second test pads to the last metal lines.

17. The semiconductor chip of claim 14, wherein the first and second test pads and the bond pads are disposed in a row.

18. The semiconductor chip of claim 16, wherein the bond pads, the first and second test pads, and the first and second conductive vias comprise sintered nano-particles.

19. The semiconductor chip of claim 16, wherein the first conductive vias are substantially a same size as the second conductive vias.

20. The semiconductor chip of claim 16, further comprising:
third and fourth test pads disposed over the passivation layer; and
further bond pads disposed between the third and fourth test pads, wherein the third and fourth test pads and the further bond pads are disposed in a row different from a row comprising the first and second test pads.

21. A semiconductor package comprising:
a first semiconductor chip mounted on a board;
a bond pad disposed over a conductive via and a passivation layer of the first semiconductor chip, the conductive via disposed in the passivation layer and electrically coupled to circuitry of the first semiconductor chip, wherein the bond pad is electrically coupled to the board; and
a dummy bond pad disposed over the passivation layer, wherein the dummy bond pad is not electrically coupled to the circuitry, and wherein the bond pad, the dummy bond pad and the conductive via comprise sintered nano-particles.

22. The semiconductor package of claim 21, wherein the bond pad is electrically coupled to the board via wirebonding loops, and wherein the dummy bond pad mechanically supports the wirebonding loops.

23. The semiconductor package of claim 21, further comprising a second semiconductor chip disposed over the first semiconductor chip.

24. The semiconductor package of claim 21, wherein the first semiconductor chip is mounted on the board via flip chip packaging, and wherein the dummy bond pad mechanically supports a flipped first semiconductor chip.

25. The semiconductor package of claim 23, wherein the bond pad is electrically coupled to the board via wirebonding loops disposed between the first and second semiconductor chips.

26. A method for forming a semiconductor component, the method comprising:
forming first features by printing a colloid over a last level of metal lines of a substrate;
depositing an insulating layer over the last level of metal lines, the insulating layer covering the first features;
removing a portion of the insulating layer exposing the first features; and
heating the colloid to form conductive vias from the first features, wherein the conductive vias are disposed in openings.

27. The method of claim 26, further comprising:
forming second features by printing a second colloid over the insulating layer, wherein the second features are formed on the first features, wherein heating the colloid forms bonding pads from the second features, and wherein the bonding pads are disposed on the conductive vias.

28. A semiconductor chip comprising:
first conductive vias disposed in an uppermost insulation layer of a semiconductor die, wherein the first conductive vias electrically couple a circuit board to last metal lines;
bond pads disposed above and electrically coupled to the first conductive vias;
second conductive vias disposed in the uppermost insulation layer, wherein the second conductive vias electrically couple to the last metal lines but not to the circuit board; and
test pads disposed above and electrically coupled to the second conductive vias, wherein the test pads are larger than the bond pads.

29. The semiconductor chip of claim 28 wherein the bond pads, the first and second test pads, and the first and second conductive vias comprise sintered nano-particles.

* * * * *